(12) United States Patent
Zhang et al.

(10) Patent No.: US 12,307,354 B2
(45) Date of Patent: May 20, 2025

(54) COMPUTE IN MEMORY THREE-DIMENSIONAL NON-VOLATILE NOR MEMORY FOR NEURAL NETWORKS

(71) Applicant: SanDisk Technologies LLC, Addison, TX (US)

(72) Inventors: Yanli Zhang, San Jose, CA (US); Yan Li, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 1016 days.

(21) Appl. No.: 17/343,228

(22) Filed: Jun. 9, 2021

(65) Prior Publication Data

US 2022/0398438 A1 Dec. 15, 2022

(51) Int. Cl.
*G11C 11/04* (2006.01)
*G06F 7/523* (2006.01)
(Continued)

(52) U.S. Cl.
CPC ........... *G06N 3/063* (2013.01); *G06F 7/5235* (2013.01); *G11C 11/54* (2013.01); *G11C 11/56* (2013.01);
(Continued)

(58) Field of Classification Search
CPC ....... G06N 3/063; G06F 7/5235; G11C 11/54; G11C 11/56; G11C 16/10; G11C 16/24; G11C 11/5628; G11C 11/5642; G11C 16/0483; G11C 16/08; G11C 16/26; H01L 24/08; H01L 25/0657; H01L 25/18; H01L 2224/08145; H01L 2924/1431; H01L 2924/14511; H01L 24/03; H01L 24/05; H01L 24/16; H01L 2224/0345;
(Continued)

(56) References Cited

U.S. PATENT DOCUMENTS 6,147,550 A 11/2000 Holloway
9,430,735 B1 8/2016 Vali et al.
(Continued)

OTHER PUBLICATIONS

Fick, L., et al., "Analog In-Memory Subthreshold Deep Neural Network Accelerator," IEEE Custom Integrated Circuits Conference (CICC), Apr.-May 2007, 4 pages.
(Continued)

*Primary Examiner* — Tha-O H Bui
(74) *Attorney, Agent, or Firm* — Pearl Cohen Zedek Latzer Baratz LLP

(57) ABSTRACT

A non-volatile memory device for performing compute in memory operations for a neural network uses a three dimensional NOR architecture in which vertical NOR strings are formed of multiple memory cells connected in parallel between a source line and a bit line. Weights of the neural network are encoded as threshold voltages of the memory cells and activations are encoded as word line voltages applied to the memory cells of the NOR strings. The memory cells are operated in the subthreshold region, where the word line voltages are below the threshold voltages. The NOR structure naturally sums the resultant subthreshold currents of the individual memory cells to generate the product of the activations and the weights of the neural network by concurrently applying input voltages to multiple memory cells of a NOR string.

20 Claims, 22 Drawing Sheets

(51) Int. Cl.
*G06N 3/063* (2023.01)
*G11C 11/54* (2006.01)
*G11C 11/56* (2006.01)
*G11C 16/10* (2006.01)
*G11C 16/24* (2006.01)
*H01L 23/00* (2006.01)
*H01L 25/065* (2023.01)
*H01L 25/18* (2023.01)

(52) U.S. Cl.
CPC .............. *G11C 16/10* (2013.01); *G11C 16/24* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ..... H01L 2224/0346; H01L 2224/0401; H01L 2224/05082; H01L 2224/05166; H01L 2224/05186; H01L 2224/05624; H01L 2224/05647; H01L 2224/16145
USPC ..................................................... 365/185.03
See application file for complete search history.

(56) References Cited

U.S. PATENT DOCUMENTS

| | | | |
|---|---|---|---|
| 9,799,788 B2 | 10/2017 | Chevallier et al. | |
| 11,120,884 B2* | 9/2021 | Salahuddin | H10B 41/27 |
| 2012/0069650 A1 | 3/2012 | Yang et al. | |
| 2016/0048755 A1* | 2/2016 | Freyman | G06F 17/11 |
| | | | 365/185.05 |
| 2019/0370639 A1 | 12/2019 | Yu | |
| 2020/0311512 A1 | 10/2020 | Choi et al. | |

OTHER PUBLICATIONS

Wang, S., "Hybrid Digital and Analog Computing for Efficiency and Generality Optimization," ISSCC ML Processor Forum, Feb. 2021, 46 pages.

Lue, H., et al., "Optimal Design Methods to Transform 3D NAND Flash into a High-Density, High Bandwidth and Low Power Non-volatile Computing in Memory (nvCIM) Accelerator for Deep-Learning Neural Networks (DNN)," IEEE International Electron Devices Meeting (IEDM), Dec. 2019, 4 pages.

* cited by examiner

| 4-level activation x 4-level weight | |
|---|---|
| Activation level controlled by $V_{WL\_i}$ (V) | Weight level controlled by $V_{t\_j}$ (V) |
| 3.9 | 4 |
| 3.8 | 4.3 |
| 3.7 | 4.6 |
| 3.6 | 4.9 |

Figure 19A

| 8-level activation x 4-level weight | |
|---|---|
| Activation level controlled by $V_{WL\_i}$ (V) | Weight level controlled by $V_{t\_j}$ (V) |
| 3.9 | 4 |
| 3.8 | 4.3 |
| 3.7 | 4.6 |
| 3.6 | 4.9 |
| 3.5 | |
| 3.4 | |
| 3.3 | |
| 3.2 | |

Figure 19B

| 16-level activation x 4-level weight | |
|---|---|
| Activation level controlled by $V_{WL\_i}$ (V) | Weight level controlled by $V_{t\_i}$ (V) |
| 3.9 | 4 |
| 3.8 | 4.15 |
| 3.7 | 4.3 |
| 3.6 | 4.45 |
| 3.5 | |
| 3.4 | |
| 3.3 | |
| 3.2 | |
| 3.1 | |
| 3 | |
| 2.9 | |
| 2.8 | |
| 2.7 | |
| 2.6 | |
| 2.5 | |
| 2.4 | |

Figure 19D

| 8-level activation x 8-level weight | |
|---|---|
| Activation level controlled by $V_{WL\_i}$ (V) | Weight level controlled by $V_{t\_i}$ (V) |
| 3.9 | 4 |
| 3.8 | 4.15 |
| 3.7 | 4.3 |
| 3.6 | 4.45 |
| 3.5 | 4.6 |
| 3.4 | 4.75 |
| 3.3 | 4.9 |
| 3.2 | 5.05 |

Figure 19C

COMPUTE IN MEMORY THREE-DIMENSIONAL NON-VOLATILE NOR MEMORY FOR NEURAL NETWORKS

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring these weights into the processing units of a processing unit can be quite intensive.

BRIEF DESCRIPTION OF THE DRAWING

Like-numbered elements refer to common components in the different figures.

FIGS. 19A-19D are tables that provide several embodiments for varying numbers of bit resolution for both inputs/activations.

DETAILED DESCRIPTION

One approach to efficiently implement the large number of multiplications involved in neural networks is through use of non-volatile memory arrays in a compute-in-memory approach that stores weight values for layers of the neural network in the non-volatile memory cells of a memory device, with inputs values for the layers applied as voltage levels to the memory arrays. For example, an in-array matrix multiplication between a layer's weights and inputs can be performed by applying the input values for the layer as bias voltages on word lines, with the resultant currents on bit lines corresponding to the product of the weight stored in a corresponding memory cell and the input applied to the word line. As this operation can be applied to all of the bit lines of an array concurrently, this provides a highly efficient inferencing operation.

Although a compute-in-memory approach can be highly efficient compared to other methods, given that neural networks, such as generative pre-trained transformers (GPTs) and deep neural networks (DNNs), can have very large numbers of layers each of very large numbers of weight values, the compute in memory multiplications can use large amounts of memory and can still be power and time intensive, even for a compute-in-memory approach. To further improve efficiencies and storage densities, the following introduces the use of a three dimensional NOR memory structures in which the memory cells are operated in the subthreshold region (i.e., where the applied control gate voltages are less than the threshold voltages of the memory cells). The weight values of the neural network are encoded as threshold voltages of the memory cell. The activations, or input values, of a layer are encoded as word line voltages. In the NOR architecture, the memory cells are organized into NOR strings where multiple memory cells are connected in parallel between a bit line and a source line, so that by concurrently applying encoded activations to the word lines of a NOR string storing weight values, the products of the activations and weights are naturally summed as the cumulative current flowing from the NOR string's bit line to its source line. By operating the memory cells in the subthreshold region, the individual currents are small resulting in low power operation, but the cumulative current on the NOR string source lines allows the sensing to be readily implemented. By using a three dimensional architecture for the NOR memory, in which the NOR strings run in a vertical direction relative the substrate of a memory die, high densities are possible so that, combined with subthreshold operation, large networks can be efficiently implemented through compute in memory operations.

Figure 1:
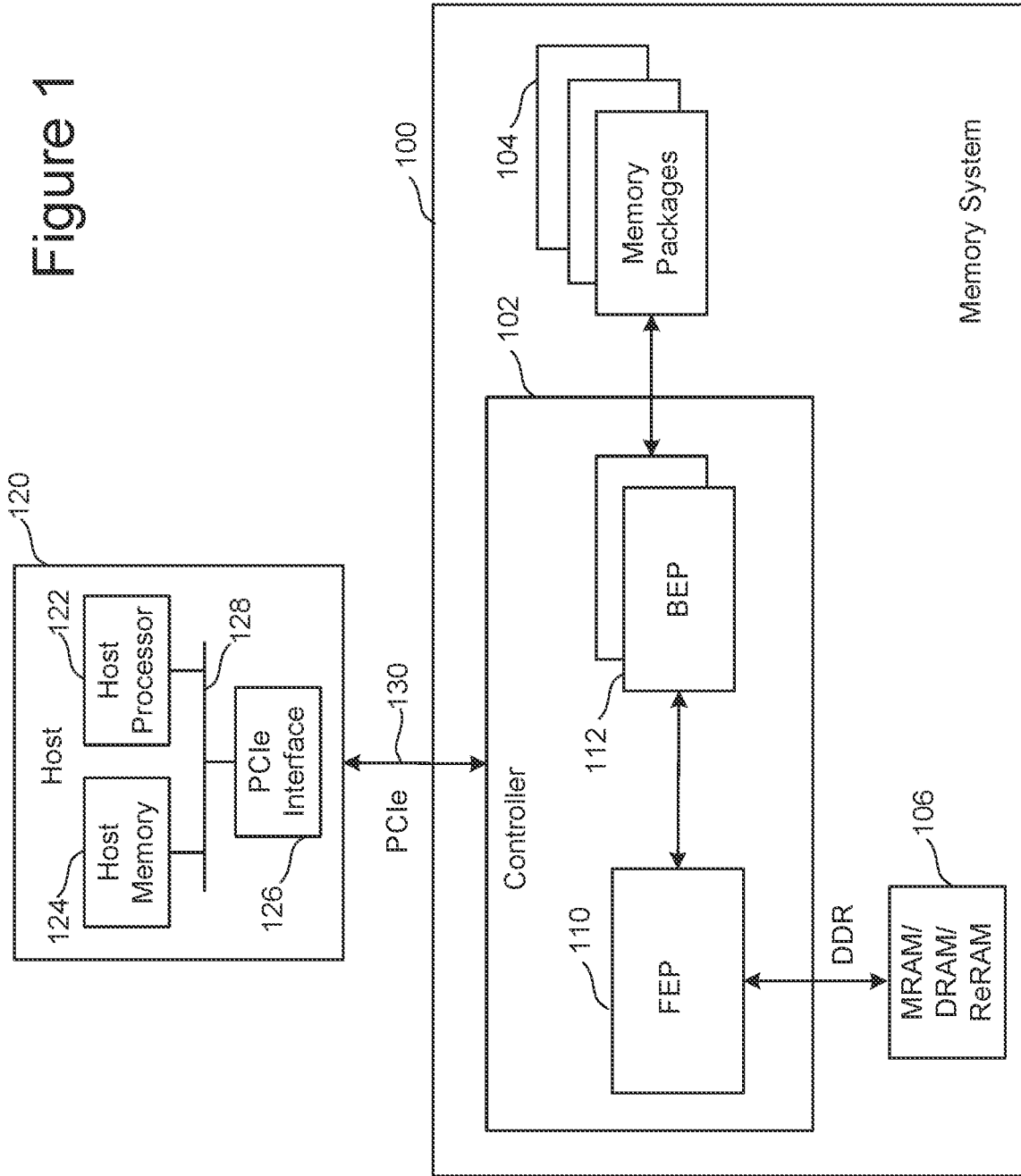
FIG. 1 is a block diagram of one embodiment of a memory system connected to a host.

FIG. 1 is a block diagram of one embodiment of a memory system 100 connected to a host 120. Memory system 100 can implement the technology presented herein for neural network operation. Many different types of memory systems can be used with the technology proposed herein. Example memory systems include solid state drives ("SSDs"), memory cards including dual in-line memories (DIMMs) for DRAM replacement, and embedded memory devices; however, other types of memory systems can also be used.

Memory system 100 of FIG. 1 comprises a controller 102, non-volatile memory 104 for storing data, and local memory (e.g., DRAM/ReRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND or NOR flash memory (including two dimensional NAND or NOR flash memory and/or three dimensional NAND or NOR flash memory). In other embodiments, the memory package can include other types of memory, such as storage class memory (SCM) based on resistive random access memory (such as ReRAM, MRAM, FeRAM or RRAM) or a phase change memory (PCM). In another embodiment, the BEP or FEP is included on the memory die.

Controller 102 communicates with host 120 via an interface 130 that implements a protocol such as, for example, NVM Express (NVMe) over PCI Express (PCIe) or using JEDEC standard Double Data Rate (DDR) or Low-Power Double Data Rate (LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, non-volatile memory, or another type of storage. Host 120 is external to and separate from memory system 100. In one embodiment, memory system 100 is embedded in host 120.

Figure 2:
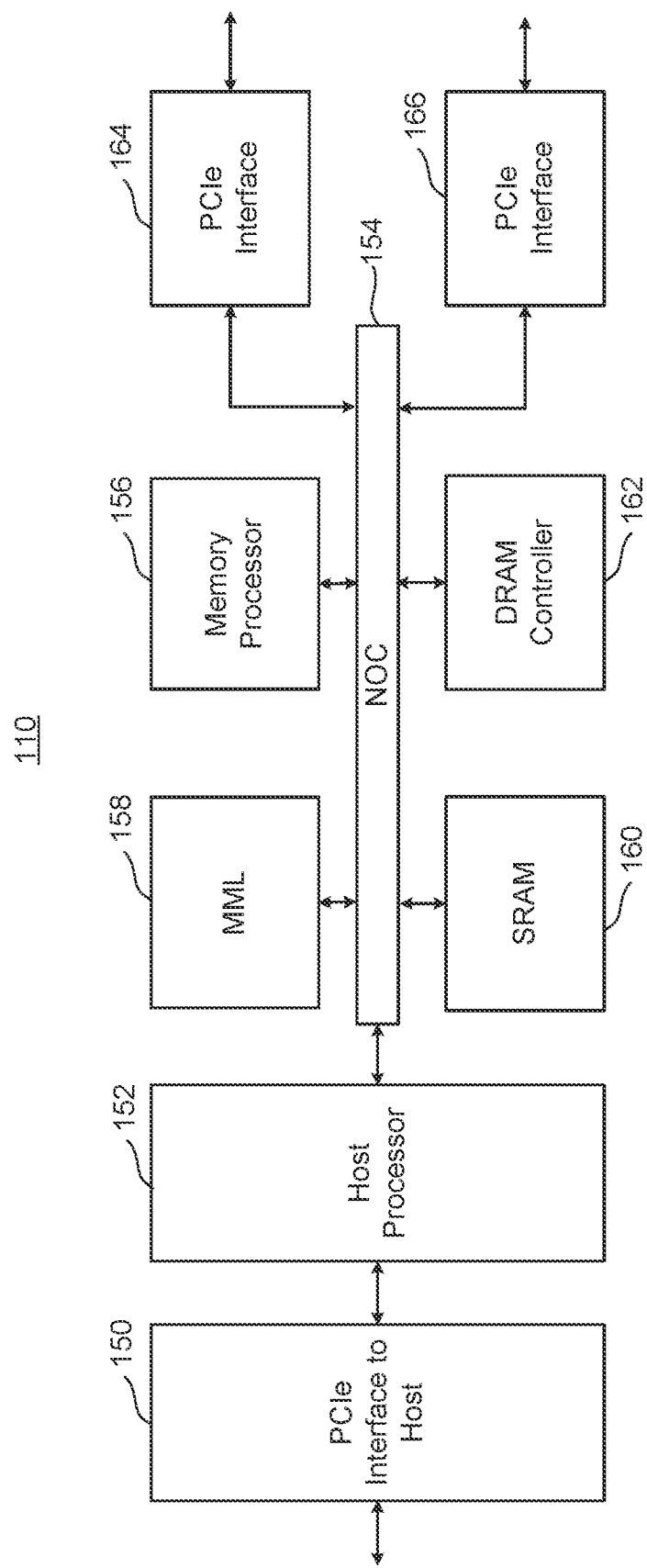
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502/602 of FIGS. 5 and 6 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
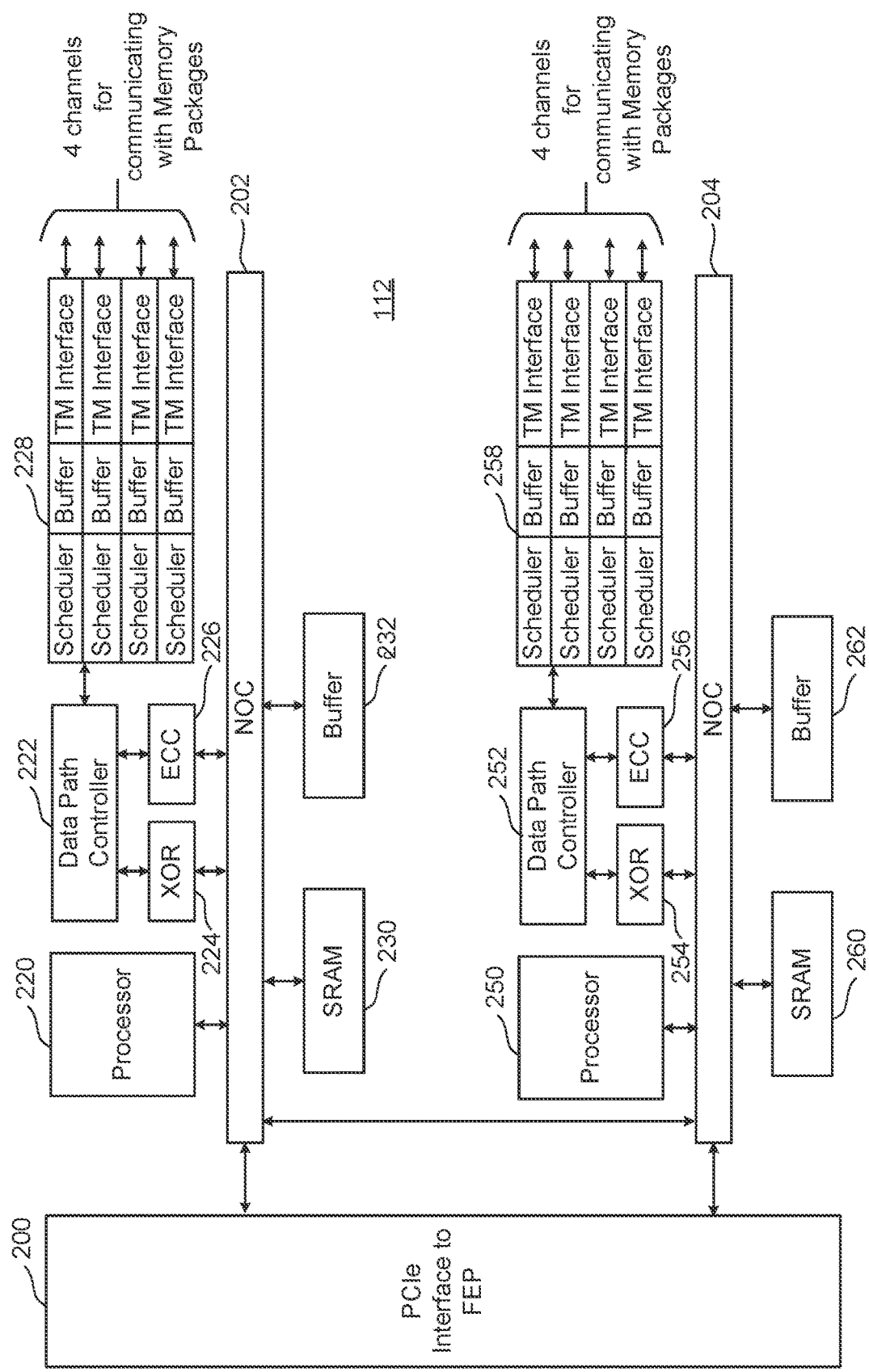
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
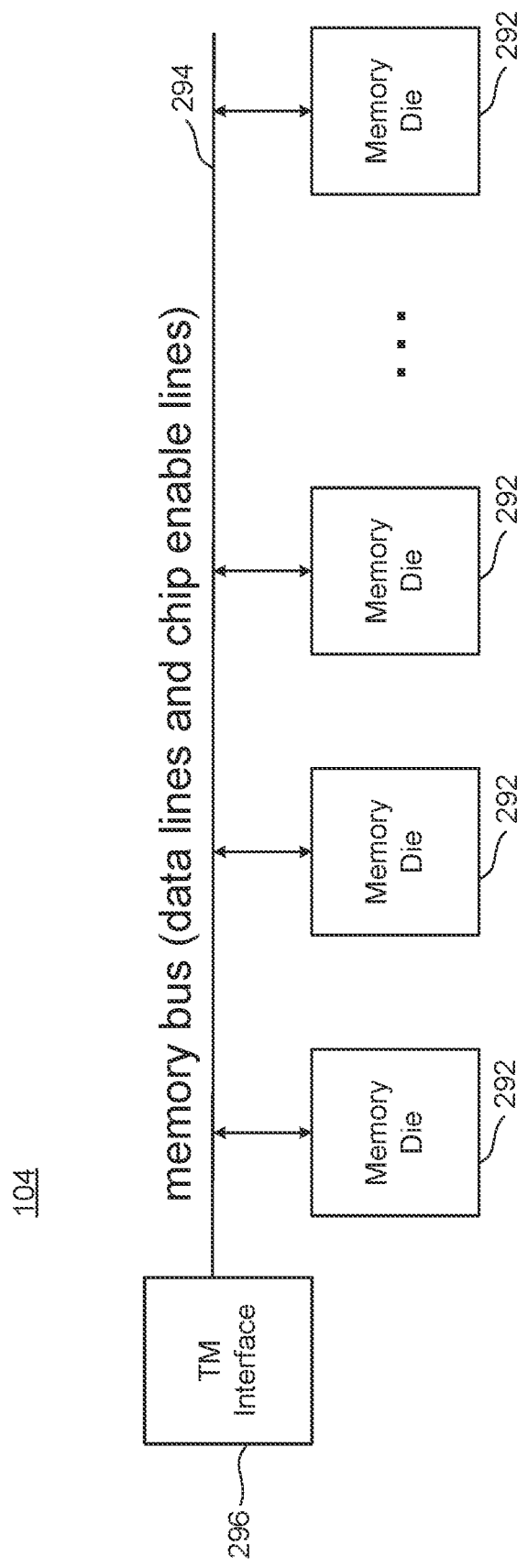
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

Figure 5:
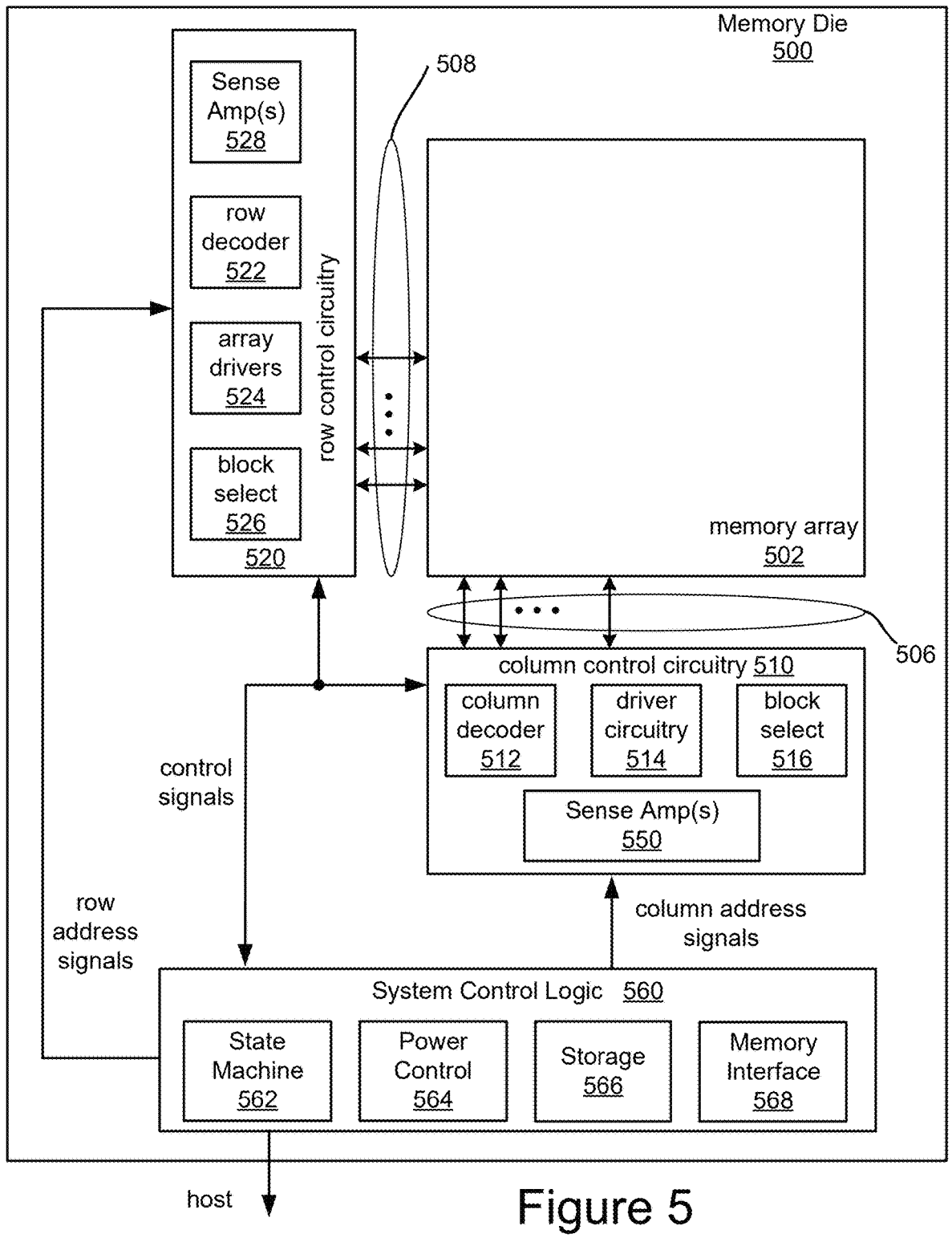
FIG. 5 is a block diagram of one embodiment of a memory die.

FIG. 5 is a block diagram that depicts one example of a memory die 500 that can implement the technology described herein. Memory die 500, which can correspond to one of the memory die 292 of FIG. 4, includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory die 500 includes row control circuitry 520, whose outputs 508 are connected to respective word lines of the memory array 502. Row control circuitry 520 receives a group of M row address signals and one or more various control signals from System Control Logic circuit 560, and typically may include such circuits as row decoders 522, array terminal drivers 524, and block select circuitry 526 for both reading and writing operations. Row control circuitry 520 may also include read/write circuitry. In an embodiment, row control circuitry 520 has sense amplifiers 550, which each contain circuitry for sensing a condition (e.g., voltage) of a word line of the memory array 502. In an embodiment, by sensing a word line voltage, a condition of a memory cell in a cross-point array is determined. Memory die 500 also includes column control circuitry 510 whose input/outputs 506 are connected to respective bit lines of the memory array 502. Although only single block is shown for array 502, a memory die can include multiple arrays or "tiles" that can be individually accessed. Column control circuitry 510 receives a group of N column address signals and one or more various control signals from System Control Logic 560, and typically may include such circuits as column decoders 512, array terminal receivers or drivers 514, block select circuitry 516, as well as read/write circuitry, and I/O multiplexers.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine 562 that provides die-level control of memory operations. In one embodiment, the state machine 562 is programmable by software. In other embodiments, the state machine 562 does not use software and is completely implemented in hardware (e.g., electrical circuits). In another embodiment, the state machine 562 is replaced by a micro-controller or microprocessor, either on or off the memory chip. The system control logic 560 can also include a power control module 564 controls the power and voltages supplied to the rows and columns of the memory 502 during memory operations and may include charge pumps and regulator circuit for creating regulating voltages. System control logic 560 includes storage 566, which may be used to store parameters for operating the memory array 502.

Commands and data are transferred between the controller 102 and the memory die 500 via memory controller interface 568 (also referred to as a "communication interface"). Memory controller interface 568 is an electrical interface for communicating with memory controller 102. Examples of memory controller interface 568 include a Toggle Mode Interface and an Open NAND Flash Interface (ONFI). Other I/O interfaces can also be used. For example, memory controller interface 568 may implement a Toggle Mode Interface that connects to the Toggle Mode interfaces of memory interface 228/258 for memory controller 102. In one embodiment, memory controller interface 568 includes a set of input and/or output (I/O) pins that connect to the controller 102.

In some embodiments, all of the elements of memory die 500, including the system control logic 560, can be formed as part of a single die. In other embodiments, some or all of the system control logic 560 can be formed on a different die.

For purposes of this document, the phrase "one or more control circuits" can include a controller, a state machine, a micro-controller and/or other control circuitry as represented by the system control logic 560, or other analogous circuits that are used to control non-volatile memory.

In one embodiment, memory structure 502 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping. In one example, the non-volatile memory cells comprise vertical NOR strings with charge-trapping. In another embodiment, memory structure 502 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 502 is not limited to the examples above. Many different types of memory array architectures or memory technologies can be used to form memory structure 502. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the structure of memory structure 502 of the memory cells and the peripheral circuitry, including all of the other elements. An important characteristic of a memory circuit is its capacity, which can be increased by increasing the area of the memory die of memory system 500 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die for the memory system 500 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND or NOR flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND or NOR memory or other memory cell technologies.

To improve upon these limitations, embodiments described below can separate the elements of FIG. 5 onto separately formed dies that are then bonded together. More specifically, the memory structure 502 can be formed on one die and some or all of the peripheral circuitry elements, including one or more control circuits, can be formed on a separate die. For example, a memory die can be formed of just the memory elements, such as the array of memory cells of flash NAND or NOR memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND or NOR memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6:
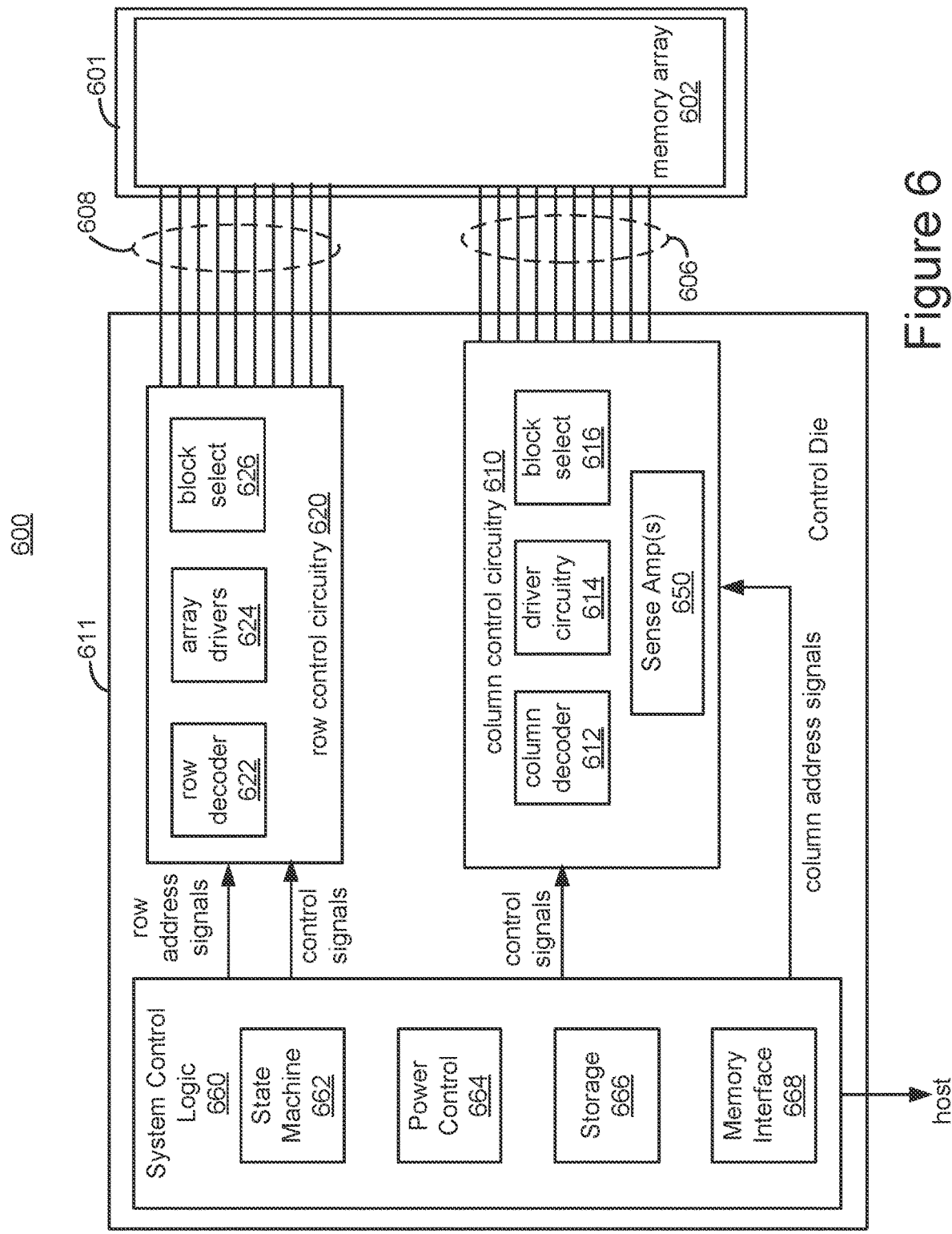
FIGS. 6 and 7 illustrate an example of control circuits coupled to a memory structure through wafer-to-wafer bonding.
Figure 7:
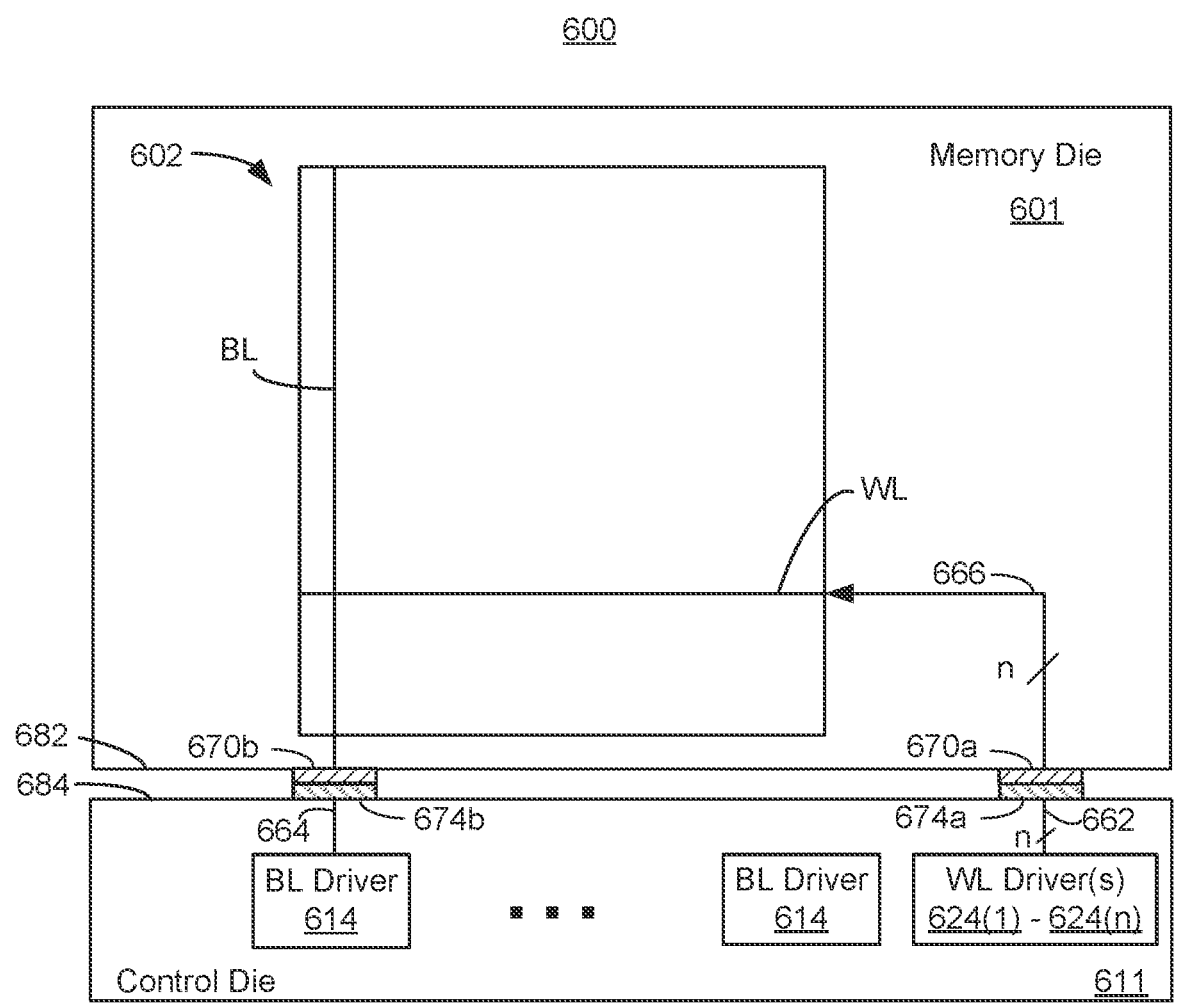

FIGS. 6 and 7 show an alternative arrangement to that of FIG. 5, which may be implemented using wafer-to-wafer bonding to provide a bonded die pair for memory system 600. FIG. 6 shows an example of the peripheral circuitry, including control circuits, formed in a peripheral circuit or control die 611 coupled to memory structure 602 formed in memory die 601. As with 502 of FIG. 5, the memory die 601 can include multiple independently accessible arrays or "tiles". Common components are labelled similarly to FIG. 5 (e.g., 502 is now 602, 510 is now 610, and so on). It can be seen that system control logic 660 (including state machine 662, power control 664, storage 666, and memory interface 668), row control circuitry 620, and column control circuitry 610 are located in control die 611. In some embodiments, all or a portion of the column control circuitry 610 and all or a portion of the row control circuitry 620 are located on the memory structure die 601. In some embodiments, some of the circuitry in the system control logic 660 is located on the on the memory structure die 601.

System control logic 660, row control circuitry 620, and column control circuitry 610 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 660, row control circuitry 620, and column control circuitry 610). Thus, while moving such circuits from a die such as memory die 292 may reduce the number of steps needed to fabricate such a die, adding such circuits to a die such as control die 611 may not require any additional process steps.

FIG. 6 shows column control circuitry 610 on the control die 611 coupled to memory structure 602 on the memory structure die 601 through electrical paths 606. For example, electrical paths 606 may provide electrical connection between column decoder 612, driver circuitry 614, and block select 616 and bit lines of memory structure 602. Electrical paths may extend from column control circuitry 610 in control die 611 through pads on control die 611 that are bonded to corresponding pads of the memory structure die 601, which are connected to bit lines of memory structure 602. Each bit line of memory structure 602 may have a corresponding electrical path in electrical paths 606, including a pair of bond pads, which connects to column control circuitry 610. Similarly, row control circuitry 620, including row decoder 622, array drivers 624, block select 626, and sense amplifiers 650 are coupled to memory structure 602 through electrical paths 608. Each of electrical path 608 may correspond to a word line, dummy word line, or select gate line. Additional electrical paths may also be provided between control die 611 and memory die 601.

For purposes of this document, the phrase "control circuit" can include one or more of controller 102, system control logic 660, column control circuitry 610, row control circuitry 620, a micro-controller, a state machine, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

FIG. 7 is a block diagram showing more detail on the arrangement of one embodiment of the integrated memory assembly of bonded die pair 600. Memory die 601 contains a plane or array 602 of memory cells. The memory die 601 may have additional planes or arrays. One representative bit line (BL) and representative word line (WL) 666 is depicted for each plane or array 602. There may be thousands or tens of thousands of such bit lines per each plane or array 602. In one embodiment, an array or plane represents a groups of connected memory cells that share a common set of unbroken word lines and unbroken bit lines.

Control die 611 includes a number of bit line drivers 614. Each bit line driver 614 is connected to one bit line or may be connected to multiple bit lines in some embodiments. The control die 611 includes a number of word line drivers 624(1)-624(n). The word line drivers 624(1)-624(n) are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 624 provide voltages to the word lines in memory die 601. As discussed above with respect to FIG. 6, the control die 611 may also include charge pumps, voltage generators, and the like that are not represented in FIG. 7, which may be used to provide voltages for the word line drivers 624 and/or the bit line drivers 614.

The memory die 601 has a number of bond pads 670a, 670b on a first major surface 682 of memory die 601. There may be "n" bond pads 670a, to receive voltages from a corresponding "n" word line drivers 624(1)-624(n). There may be one bond pad 670b for each bit line associated with array 602. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 600. For example, the data bus between the memory controller 102 and the integrated memory assembly 600 may, for example, provide for eight, sixteen, or perhaps 32 bits to be transferred in parallel. However, the data bus between the memory controller 102 and the integrated memory assembly 600 is not limited to these examples.

The control die 611 has a number of bond pads 674a, 674b on a first major surface 684 of control die 611. There may be "n" bond pads 674a, to deliver voltages from a corresponding "n" word line drivers 624(1)-624(n) to memory die 601. There may be one bond pad 674b for each bit line associated with array 602. The reference numeral 674 will be used to refer in general to bond pads on major surface 682. Note that there may be bond pad pairs 670a/674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 601 to the control die 611. Also, the bond pads 670, 674 permit internal signal transfer between the memory die 601 and the control die 611. Thus, the memory die 601 and the control die 611 are bonded together with bond pads.

Although FIG. 6 depicts one control die 611 bonded to one memory die 601, in another embodiment one control die 611 is bonded to multiple memory dies 601.

Herein, "internal signal transfer" means signal transfer between the control die 611 and the memory die 601. The internal signal transfer permits the circuitry on the control die 611 to control memory operations in the memory die 601. Therefore, the bond pads 670, 674 may be used for memory operation signal transfer. Herein, "memory operation signal transfer" refers to any signals that pertain to a memory operation in a memory die 601. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum, and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier may be electrically connected to bond pad 674b by pathway 664. Relative to FIG. 6, the electrical paths 606 can correspond to pathway 664, bond pads 674b, and bond pads 670b. There may be thousands of such sense amplifiers, pathways, and bond pads. Note that the BL does not necessarily make direct connection to bond pad 670b. The word line drivers 624 may be electrically connected to bond pads 674a by pathways 662. Relative to FIG. 6, the electrical paths 608 can correspond to the pathway 662, the bond pads 674a, and bond pads 670a. Note that pathways 662 may comprise a separate conductive pathway for each word line driver 624(1)-624(n). Likewise, a there may be a separate bond pad 674a for each word line driver 624(1)-624(n). The word lines in block 2 of the memory die 601 may be electrically connected to bond pads 670a by pathways 664. In FIG. 7, there are "n" pathways 664, for a corresponding "n" word lines in a block. There may be separate pair of bond pads 670a, 674a for each pathway 664.

Relative to FIG. 5, the on-die control circuits of FIG. 6 can also include addition functionalities within its logic elements, both more general capabilities than are typically found in the memory controller 102 and some CPU capabilities, but also application specific features.

In the following, system control logic 560/660, column control circuitry 510/610, row control circuitry 520/620, and/or controller 102 (or equivalently functioned circuits), in combination with all or a subset of the other circuits depicted in FIG. 5 or on the control die 611 in FIG. 6 and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

Turning now to types of data that can be stored in non-volatile memory devices, a particular example of the type of data of interest in the following discussion is the weights used is in artificial neural networks, such as convolutional neural networks or CNNs. The name "convolutional neural network" indicates that the network employs a mathematical operation called convolution, that is a specialized kind of linear operation. Convolutional networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

Figure 8:
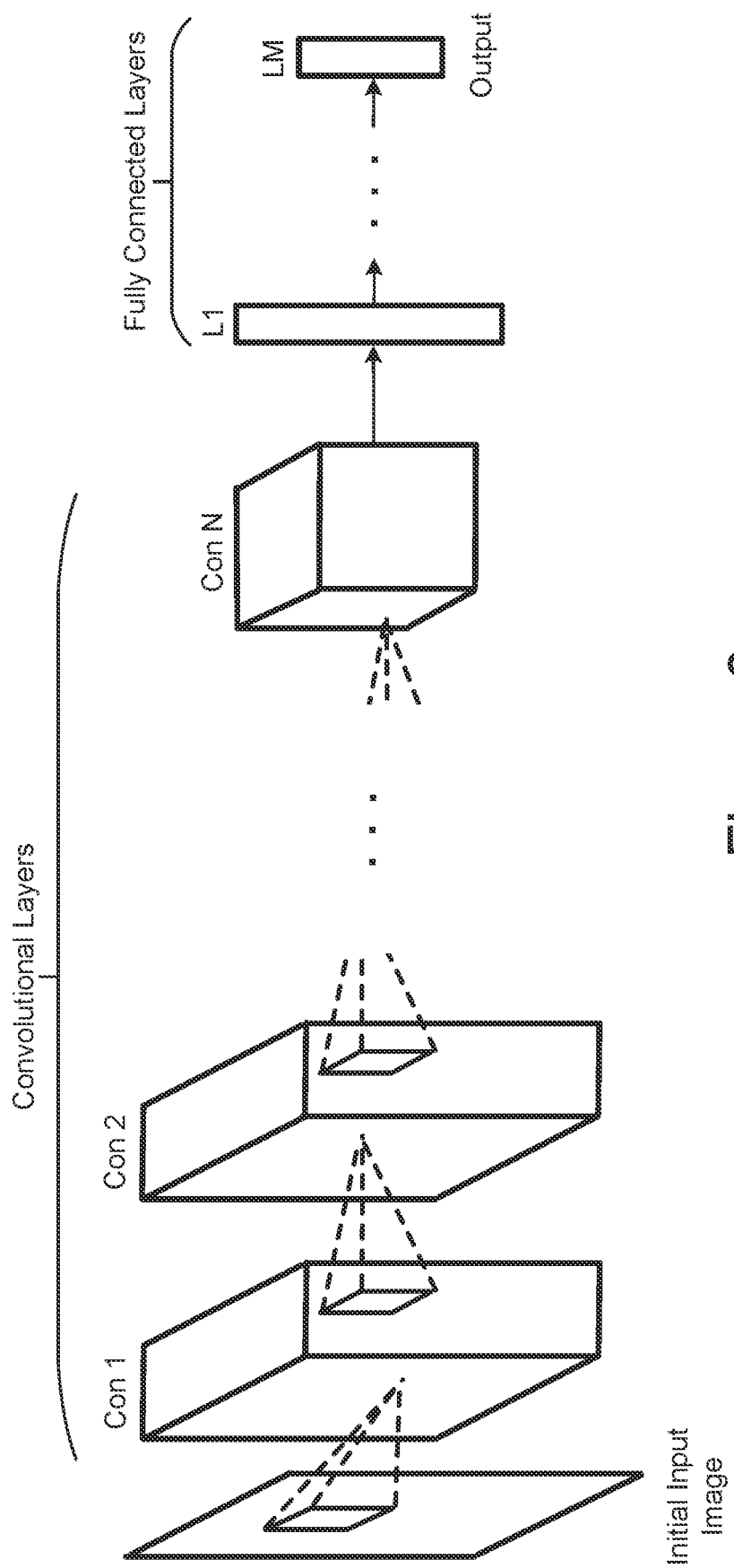
FIG. 8 illustrates a simple example of a convolutional neural network (CNN).

FIG. 8 is a schematic representation of an example of a CNN. FIG. 8 illustrates an initial input image of an array of pixel values, followed by a number of convolutional layers that are in turn followed by a number of fully connected layers, the last of which provides the output. Each neuron in the first convolutional layer (Con 1) takes as input data from an n×n pixel sub-region of the input image. The neuron's learned weights, which are collectively referred to as its convolution filter, determine the neuron's single-valued output in response to the input. In the convolutional layers, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through each of the convolutional layers (Con1 to Con N) using each layer's learned weights, after which it is propagated through the fully connected layers (L1 to LM) using their learned weights.

Figure 9:
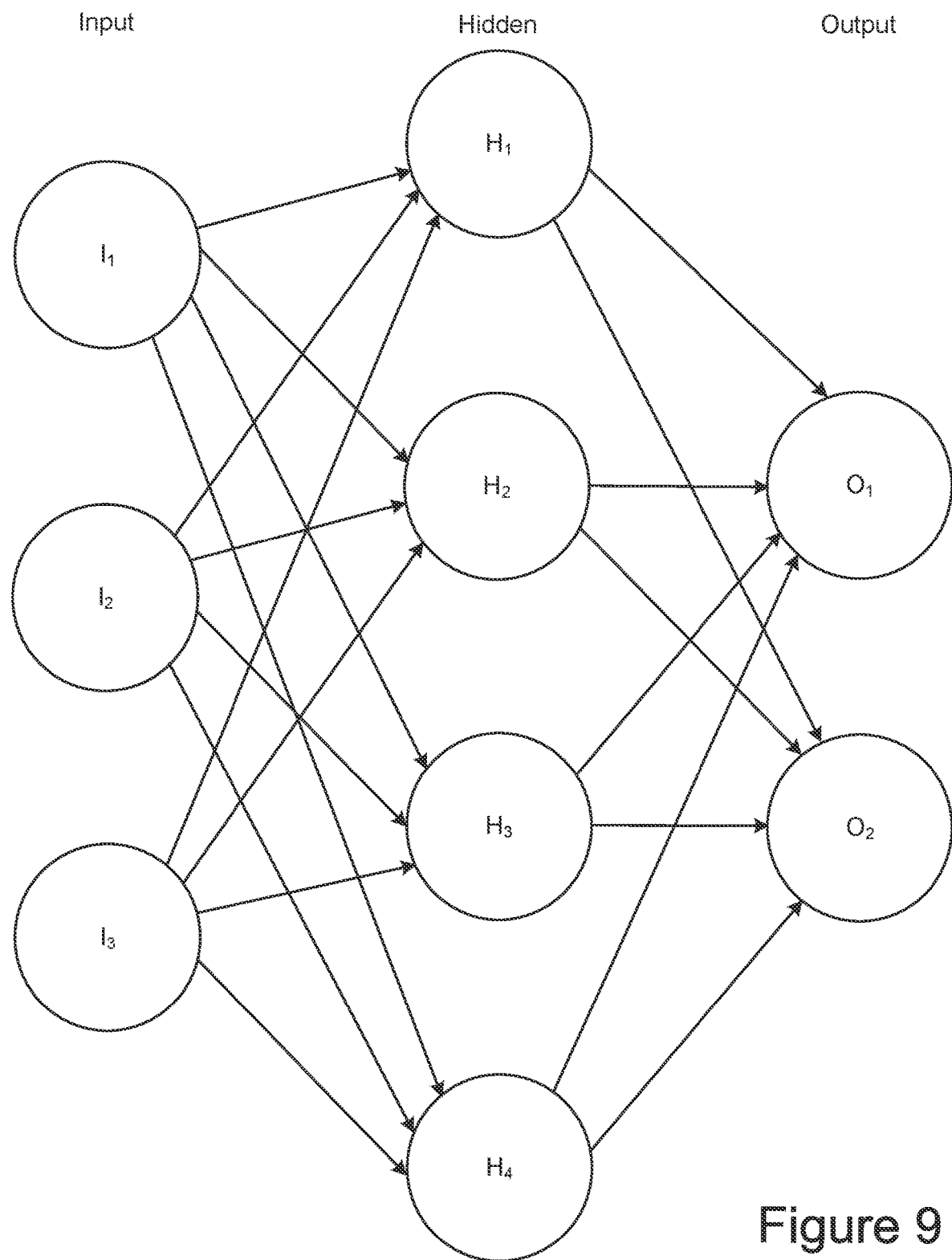
FIG. 9 illustrates a simple example of fully connected layers in an artificial neural network.

FIG. 9 represents several fully connected layers of a neural network in more detail. In FIG. 9, the shown three layers of the artificial neural network are represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually, each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer) to the last layer (the output layer), possibly after traversing the layers multiple times. Although FIG. 8 shows only a single intermediate or hidden layer, a complex deep neural network (DNN) can have many such intermediate layers.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 10B:
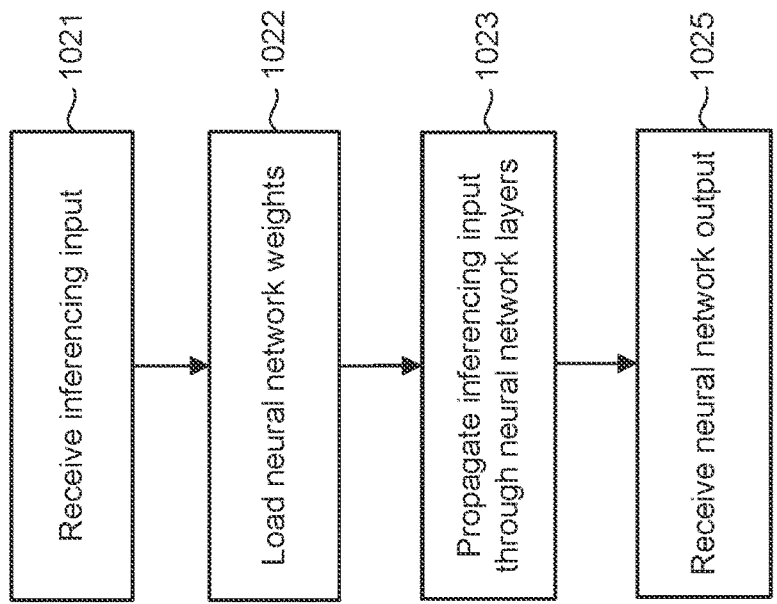
FIG. 10B is a flowchart describing one embodiment of a process for inference using a neural network.
Figure 10A:
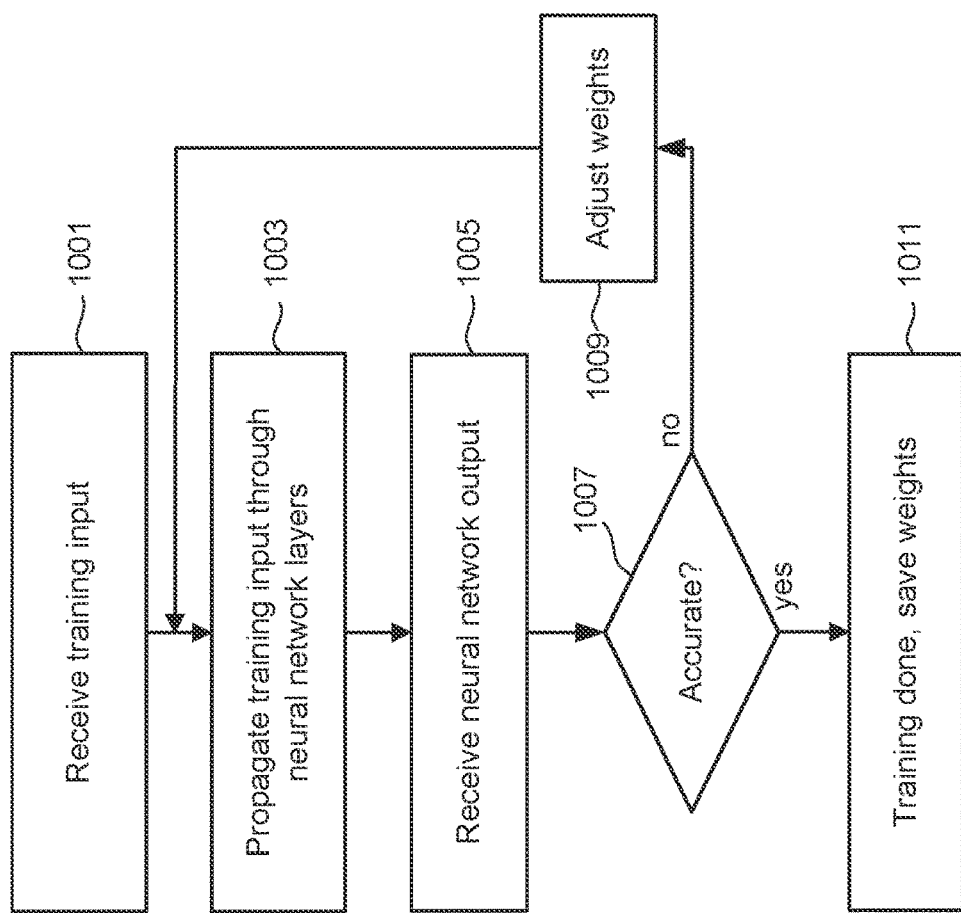
FIG. 10A is a flowchart describing one embodiment of a process for training a neural network to generate a set of weights.

FIG. 10A is a flowchart describing one embodiment of a process for training a neural network to generate a set of weights. The training process is often performed in the cloud, allowing additional or more powerful processing to be accessed. At step 1001, the input, such as a set of images, is received (e.g., the image input in FIG. 8). At step 1003 the input is propagated through the layers connecting the input to the next layer (e.g., CON1 in FIG. 8) using the current filter, or set of weights. The neural network's output is then received at the next layer (e.g., CON2 in FIG. 8) in step 1005, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 1005. A user can then review the results at step 1007 to select which probabilities the neural network should return and decide whether the current set of weights supply a sufficiently accurate labelling and, if so, the training is complete (step 1011). If the result is not sufficiently accurate, the neural network adjusts the weights at step 1009 based on the probabilities the user selected, followed by looping back to step 1003 to run the input data again with the adjusted weights. Once the neural network's set of weights have been determined, they can be used to "inference," which is the process of using the determined weights to generate an output result from data input into the neural network. Once the weights are determined at step 1011, they can then be stored in non-volatile memory for later use, where the storage of these weights in non-volatile memory is discussed in further detail below.

FIG. 10B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 1021, the input is received, such as the image of a dog in the example used above. If the previously determined weights are not present in the device running the neural network application, they are loaded at step 1022. For example, on a host processor executing the neural network, the weights could be read out of an SSD in which they are stored and loaded into RAM on the host device. At step 1023, the input data is then propagated through the neural network's layers. Step 1023 will be similar to step 1003 of FIG. 10B, but now using the weights established at the end of the training process at step 1011. After propagating the input through the intermediate layers, the output is then provided at step 1025.

Figure 11:
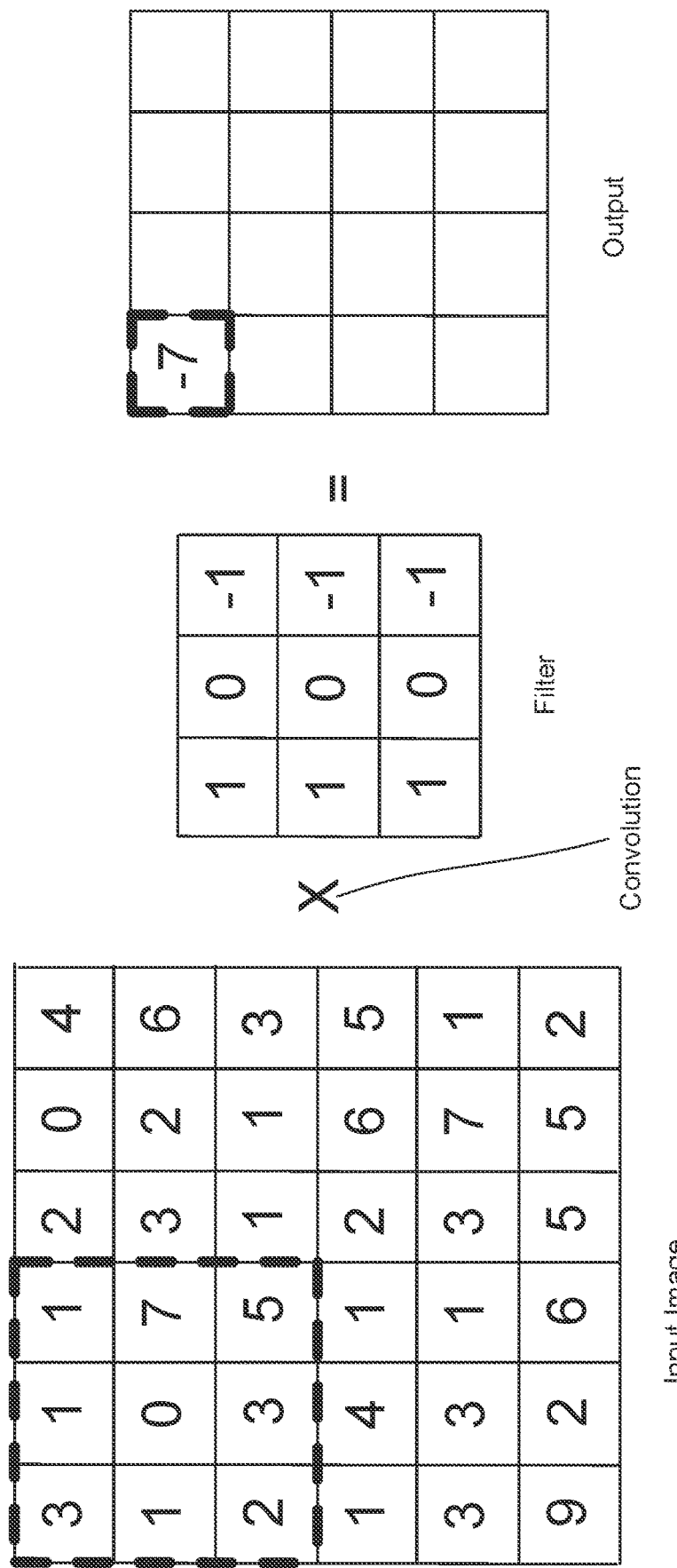
FIG. 11 is a schematic representation of a convolution operation in a convolutional neural network.

FIG. 11 is a schematic representation of a convolution operation between an input image and filter, or set of weights. In this example, the input image is a 6×6 array of pixel values and the filter is a 3×3 array of weights. The convolution operation is performed by a matrix multiplication of the 3×3 filter with 3×3 blocks of the input image. For example, the multiplication of the upper-left most 3×3 block of the image with the filter results in the top left value of the output matrix. The filter can then be slid across by one pixel on the image to generate the next entry of the output, and so on to generate a top row of 4 elements for the output. By repeating this by sliding the filter down a pixel at a time, the 4×4 output matrix is generated. Similar operations are performed for each of the layers. In a real CNN, the size of the data sets and the number of convolutions performed mean that extremely large numbers of such operations are performed involving very large amounts of data.

Figure 12:
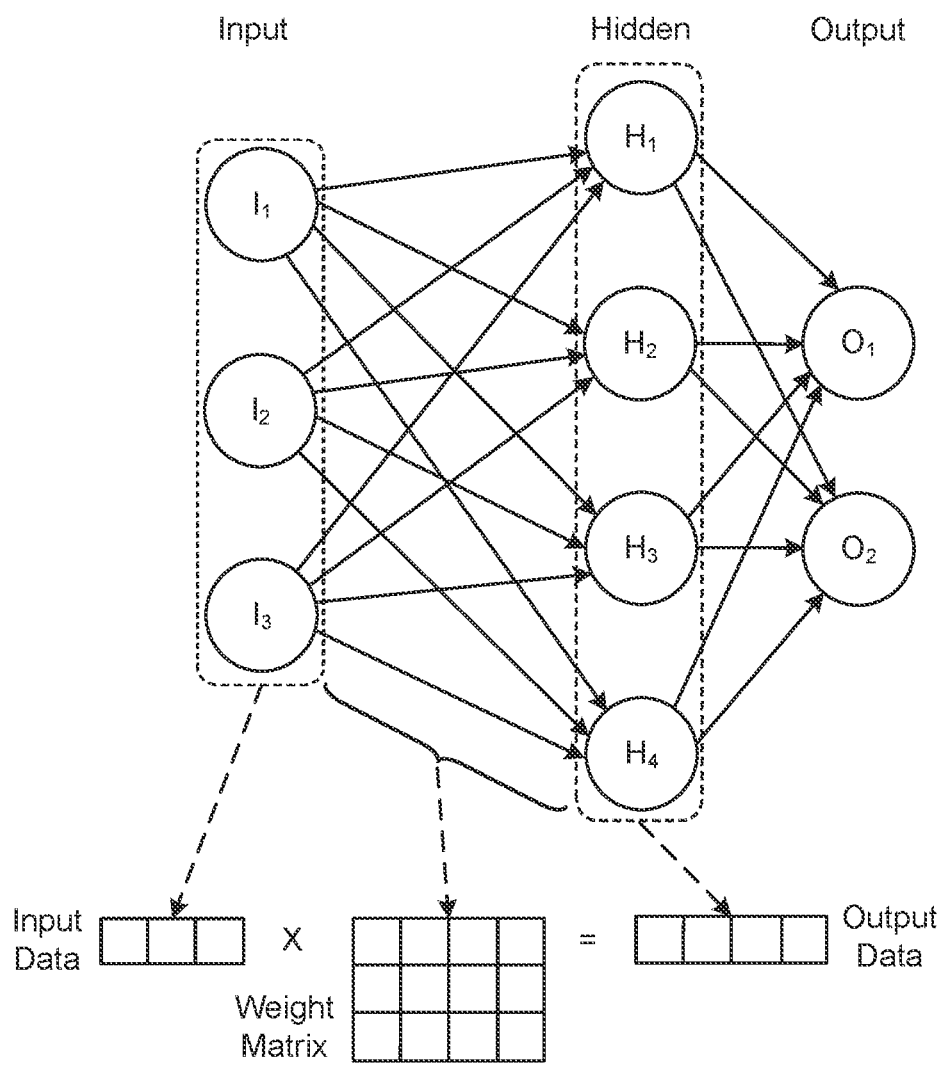
FIG. 12 is a schematic representation of the use of matrix multiplication in a fully connected layer of a neural network.

FIG. 12 is a schematic representation of the use of matrix multiplication in a fully connected layer of a neural network. Matrix multiplication, or MatMul, is a commonly used approach in both the training and inference phases for neural networks and is used in kernel methods for machine learning. FIG. 12 at the top is similar to FIG. 9, where only a single hidden layer is shown between the input layer and the output layer. The input data is represented as a vector of a length corresponding to the number of input nodes. The weights are represented in a weight matrix, where the number of columns corresponds to the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

Another artificial intelligence application that involves multiplication of large matrices and/or large input vectors is for Generative Pre-trained Transformers (GPTs). A GPT is an autoregressive language model based on unsupervised machine learning. GPTs may be used to, for example, generate human-like text based on an input prompt. GPTs may have an extremely large number of parameters, thereby, requiring large matrices.

Figure 13:
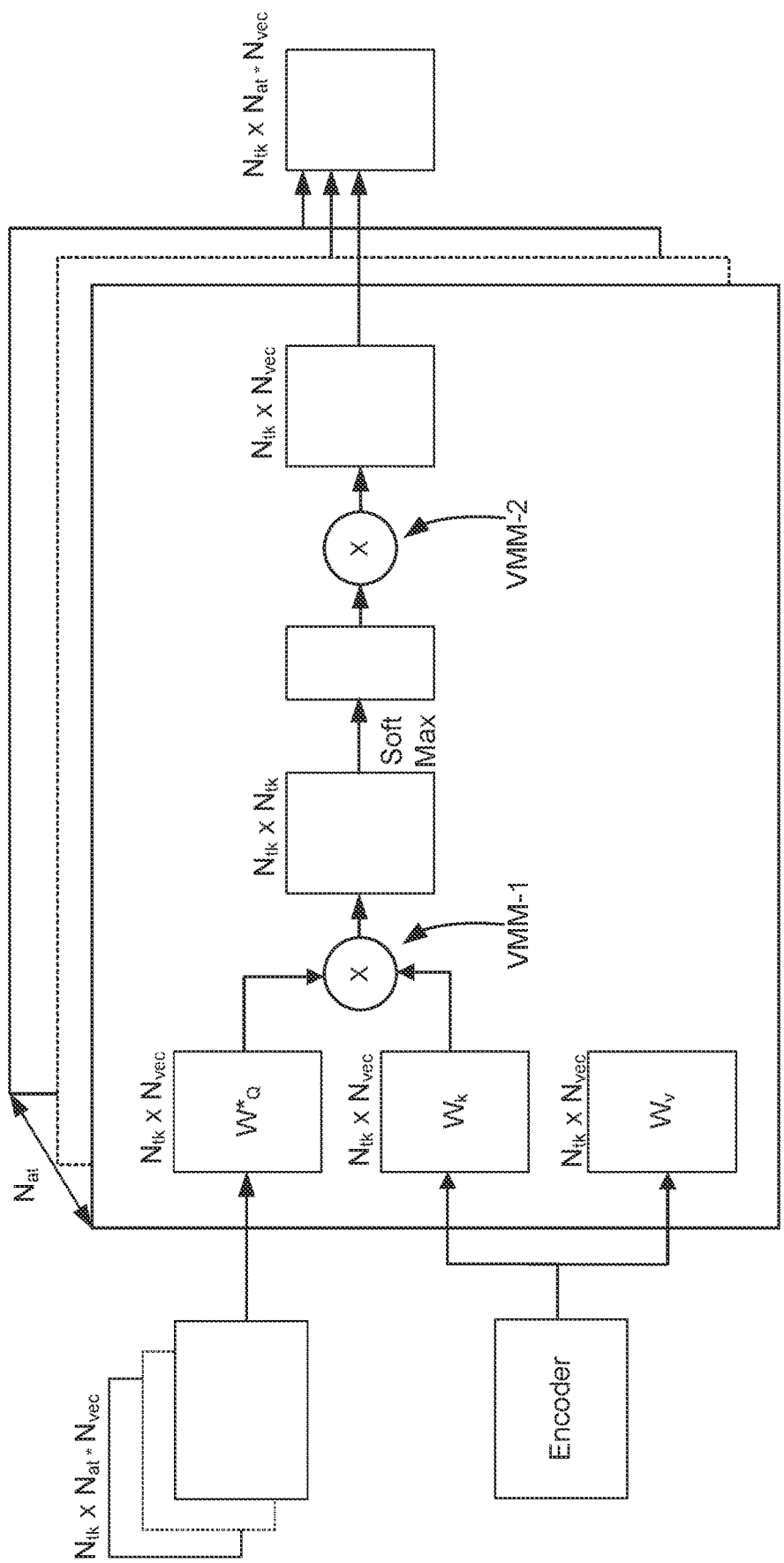
FIG. 13 depicts an example of a flow of computations in a generative pre-trained transformer (GPT).

FIG. 13 depicts an example of a flow of computations in a portion of a GPT, in which VMMs (vector-matrix multiplications) of an input vector and a weight matrix are performed for a multi-head attention units of GPT. The number of attention heads ($N_{at}$) can be quite large (on the order of a hundred, for example) and the weight matrices $W^*_Q$, $W_K$, and $W_V$ are of size $N_{tk} \times N_{VEC}$ can also be very large (on the order of thousands for $N_{tk}$, for example). At left, the inputs of are matrices of dimension $N_{tk} \times (N_{at} * N_{VEC})$ and also encoder inputs that are multiplied with the weight matrices. Following in the initially multiplications with the weights follow computations such ae VMM-1 and VMM-2, which have multiplications of between vectors and matrices of respective sizes $[1 \times N_{VEC}] * [N_{VEC} \times N_{tk}]$ and $[1 \times N_{tk}] * [N_{tk} \times N_{VEC}]$. As these structures tend to be very fully connected and the large weight matrices tend to not be sparse, the number and size of VMMs required for a GPT can be large even when compared to the CNNs and fully connected layers of neural networks described above.

To improve performance and energy efficiency, and reduce bandwidth limitation by eliminating the cost of data movement across memory hierarchy, the large number of multiplications involved in implementing neural networks can be done by CiM (Compute-in-memory) techniques using the non-volatile memory structures described above with respect to FIGS. 1-7. These can be done using a number of memory technologies and architectures, but a high-density 3D NOR architecture offers a number of advantages when implementing large vector-matrix multiplications for CiM.

Figure 14:
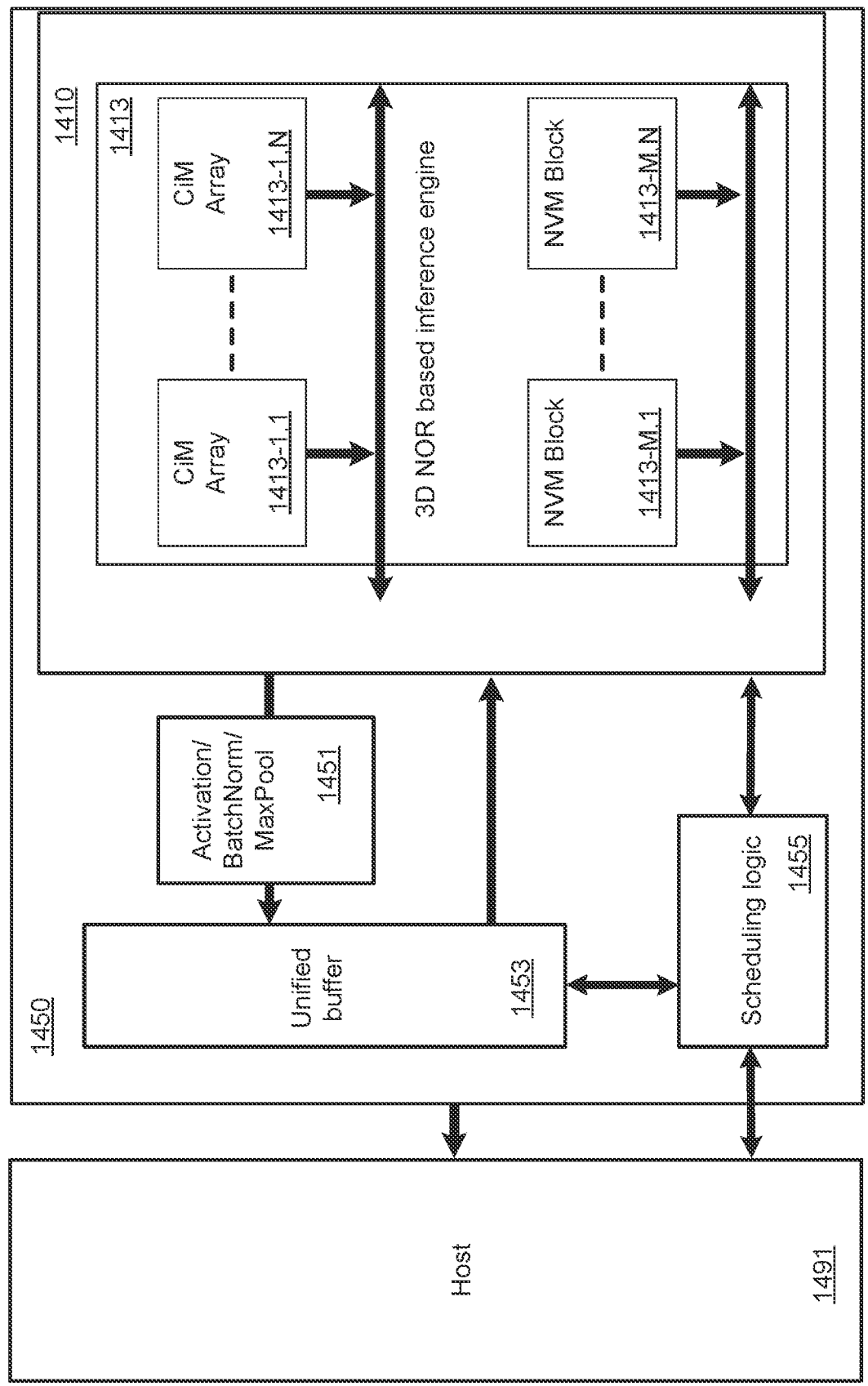
FIG. 14 is a block diagram of a high-level architecture of a compute in memory inference engine.

FIG. 14 is a block diagram of a high-level architecture of an embodiment for a compute in memory inference engine that provides context for the follow discussion. In FIG. 14, a non-volatile memory device 1450 includes a memory die 1410 of multiple memory blocks 1413 represented as M rows and N columns of arrays, including a general non-volatile memory portion, of which two blocks 1413-(M,1) and 1413-(M,N) are shown, and a (CIM) inference engine portion, of which two blocks 1413-(1,1) and 1413-(1,N) are shown. In the following, the CIM blocks are based on a 3D NOR architecture. The general usage NVM blocks can also be of a 3D NOR architecture or can be different, such as 3D NAND or storage class memory. Each of the CIM blocks of memory die 1410 can be operated to compute in-memory the multiply and accumulate operations of a vector-matrix multiplication as described below. The memory die 1410 of FIG. 14 only represents the memory blocks, but can also include additional peripheral/control elements of FIG. 5 or can be the memory die of a bonded die pair as in FIG. 6.

In addition to the one or more control circuits that generate the product values from the integrated circuit of memory die 1410, other elements on the memory device (such as on the controller 102) include a unified buffer 1453 that can buffer data being transferred from the host device 1491 to the memory die 1410 and also receive data from the memory die 1410 being transferred from to the host device 1491. For use in inferencing, neural network operations such as activation, batch normalization, and max pooling 1451 can be performed by processing on the controller for data from the memory die 1410 before it is passed on to the unified buffer 1453. Scheduling logic 1455 can oversee the inferencing operations.

In the embodiment of FIG. 14, the memory die 1410 is 3D NOR memory, but other embodiments can be based on other memory technologies. In the embodiment of FIG. 14, the memory die includes a number of memory blocks or sub-arrays 1413-i,j, some that are configured to operate as a CIM inference engine and others that can work as basic memory and can be employed, for examples, as buffers in a multiple layer neural network or a large neural network that cannot fit in a single memory device. The embodiment of FIG. 14 can be referred to as having inter-chip heterogenous functions. In alternate embodiments, an intra-chip heterogenous arrangement of multiple memory dies can be used, were some chips support CiM inference, while others are basic memory, or where the two variations can be combined.

A compute in memory approach to neural networks can have a number of advantages for machine learning applications operating in energy-limited systems. The weights are stationary stored in the arrays 1413 of the inference engine, thus eliminating unnecessary data movement from/to the host. The input data can be programmed by the host 1491 to access CIM arrays such as 1413-1,1 and 1413-1,N and computational logic can be replaced by memory cell access.

The compute in memory inference engine can be integrated as accelerators to support machine learning applications in the larger memory system or for a host device (e.g., 1491). Additionally, the structure is highly scalable with model size.

Although a compute in memory neural network architecture allows for relatively efficient computations, neural networks can have many layers each with large weight matrices, requiring vary large numbers of weight values to be stored. Consequently, although compute in memory systems can greatly increase the efficiency of neural network operations, their efficiency can be further improved based on the memory technology used for CiM arrays. In particular, the following considers the use of 3D NOR architectures in which the memory cells are operated in the sub-threshold region.

Returning to FIG. 12, as illustrated there, if the output data in the m dimensional vector $[H]_m$, the weight matrix is the n×m dimensional matrix $[W]_{n \times m}$, and the input, or activation, is n dimensional vector $[A]_n$, these are related in the neural network computation as:

$$[H]_m = [W]_{n \times m} \times [A]_n,$$

where A is used for the activations, or inputs, in the following to avoid confusion with values for the current values. For instance, looking at a single element $H_j$ of $[H]_m$, this product corresponds to:

$$H_j = \Sigma_{i=0}{}^n W_{ji} * A_i.$$

These multiplications can be mapped naturally onto a NOR memory structure by encoding the weight values as threshold voltage values $V_t$ for the memory cells and encoding the input activations of a layer as word line voltages $V_{WL}$, with the resultant currents corresponding to the outputs.

Figure 15:
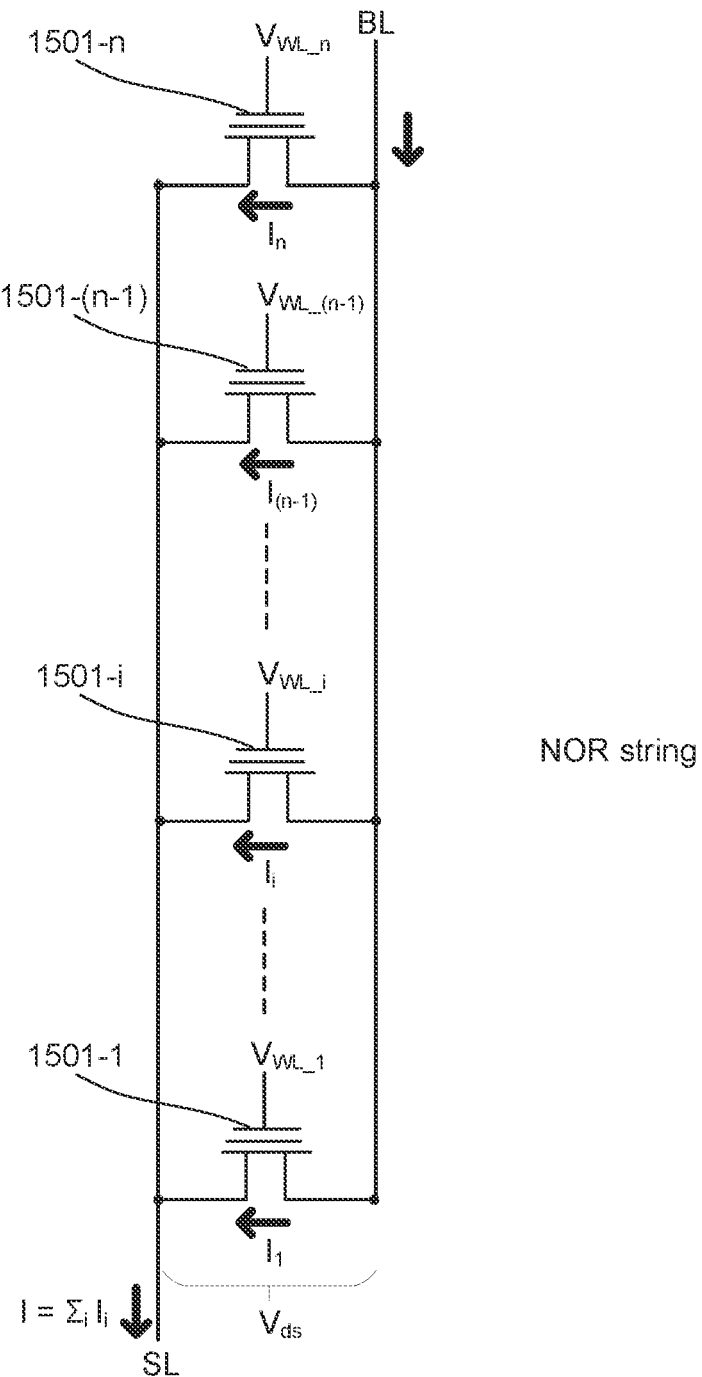
FIG. 15 illustrates a NOR string of memory cells.

FIG. 15 illustrates a NOR string of memory cells 1501-$i$, $i=1, \ldots, n$, in which the individual memory cells are connected in parallel between a bit line BL and a source line SL. Each of the memory cells 1501-$i$ is a programmable threshold voltage device, such a MOSFET with a charge storage region, such as a floating gate or dielectric region located between the control gate and channel region, where the threshold voltage $V_{t\_i}$ is programmed to different levels by storing different amount of change in the charge storage region. To read a memory cell 1501-$i$, the bit line BL and source line SL are biased with a drain-source voltage $V_{ds}$ between bit line BL and source line SL, a control gate voltage is applied to the control gate by a corresponding word line WL-i, inducing a current $I_i$ through the cell. The current $I_i$ will depend on the value of $V_{WL\_i}$ relative to $V_{t\_i}$ and can be measured on the source line or bit line to determine a data state stored in the memory cell.

The memory cells of a NOR string are usually read one at a time to extract their individual data content, since, if multiple cells are providing current at the same time, the NOR string structure will automatically sum the individual currents $I = \Sigma_i I_i$ over the word lines $WL_i$ for all of the on memory cells, so that the sensing circuitry will not be able to determine the state of the individual memory cells. However, this automatic current summing allows the NOR structure to automatically compute vector-matrix multiplications: by encoding weight values as threshold values of the memory cells and encoding the input, or activation, values as word line voltages, the output values for a neural network node correspond to the resultant current for the NOR string.

Consequently, the NOR memory structure readily lends itself to use in neural network and other applications that use vector-matrix multiplication. To increase memory density, and allow for multiplication involving larger weight matrices, a 3D NOR architecture can be used, in which the NOR strings run in a vertical direction relative to the memory die substrate. NAND memory architectures have become more common than NOR memory architectures, as they can achieve higher densities in terms of memory cells per a given array; however, NAND memory is organized into NAND strings in which, to sense a selected memory cell, all of the other non-selected memory cells need to be biased into an ON state, regardless of their threshold voltage. Consequently, a sensing operation of a NAND architecture memory can be more current/power intensive that a corresponding sensing operation in a NOR architecture memory, which, given the size and number of weight matrices involved in a GPT computation, this can be significant.

The embodiments presented here can also achieve significant power savings by operating the memory cells of the memory array in the subthreshold region, where the word line voltage is below the threshold voltage of the selected memory cell. For a MOSFET transistor, in most circumstances the subthreshold region is considered to be an "OFF" state and any current is considered undesirable leakage and of small amplitude, where MOSFETs are usually operated in the active mode or the linear region where the control gate voltage level is higher than the device's threshold voltage. One drawback in using MOSFET based memory cells in the subthreshold region is that, due to the low current amplitude for a memory cell in the subthreshold region, it can be difficult to accurately measure the current levels and determined the data state stored by the memory cell. In the context of a matrix multiplication, however, when multiple memory cells of a NOR string are concurrently activated and contribute to the current, the resultant current of the NOR string can have sufficient amplitude to allow for accurate measurement. This allows for memory cells of large NOR strings to be concurrently sensed with low power consumption, making a 3D NOR architecture operating in the subthreshold region particularly suited to the large scale vector-matrix multiplications of neural networks.

In a 3D NOR structure, such as illustrated in FIG. 15, one set of multiplication can be done in each string, with many multiplications concurrently executed in the 3D NOR array. When the NOR memory cells are operating in the subthreshold region, the combined current flowing between the bit line and source line can be expressed as:

$$I=\Sigma_i I_i = \Sigma_i I_{s\_i} \exp[q(V_{WL\_i} - V_{t\_1})/nkT]*(1 - \exp[-qV_{ds}/kT]),$$ (equation 1)

where sum i is over the memory cells 1501-$i$ of the NOR string. In equation 1:

$V_{WL\_i}$ is the word line voltage applied by word line $WL_i$ to the control gate of memory cell 1501-$i$;

$V_{t\_i}$ is the threshold voltage of memory cell 1501-$i$;

$V_{ds}$ is the drain-source voltage difference between the bit line BL and source line SL;

$I_{s\_i}$ is the drain-source current of memory cell 1501-$i$ when $V_{gs}=V_t$, where $V_{gs}$ is the gate-source voltage;

k is the Boltzmann constant, q is the electrical charge of an electron, where these are elements of the thermal voltage $V_T=kT/q$ of a p-n junction; and $n=1+(C_{dep}/C_{ox})$ is the "slope factor", where $C_{dep}$ is the capacitance of the depletion layer and $C_{ox}$ is the capacitance of the oxide layer.

If the activations are encoded as:

Activation $A_i=A_i(V_{WL\_i})=\exp[qV_{WL\_i}/nkT]$, which is controlled the input voltage $V_{WL\_i}$ biasing the word line WLi; and the weights are encoded as Weight $W_i=W_i(V_{t\_i})=I_{s\_i} \exp[-qV_{t\_i}/nkT]*(1-\exp[-qV_{ds}/kT])$, which is controlled by threshold voltage $V_{t\_i}$ programmed into memory cell 1501-$i$, equation 1 can be rewritten as:

$$I = \Sigma_i I_i$$ (equation 2)
$$= \Sigma_i I_{s\_i} \exp[q(V_{WL\_i} - V_{t\_1})/nkT] * (1 - \exp[-qV_{ds}/kT])$$
$$= \Sigma_i A_i(V_{WL\_i}) * W_i(V_{t\_i}).$$

Consequently, it follows that the output $H_j$ of the multiplication $H_j=\Sigma_{i=0}^n W_{ji}*A_i$ corresponds to the current in the j-th NOR string. Thus, encoding the activations, or inputs, of a layer as word line voltages and encoding the weights of the layer as the threshold voltages allows for the vector matrix multiplication of the outputs to be computed as the current level measured either on the bit line or the source line of the NOR string. If the dimension of the input vector and weight matrix exceed the size of a NOR string, the result of several NOR strings can be combined, such as by combined the current from the local source lines of the individual NOR strings on a global source line and measuring the combined current.

Figure 16:
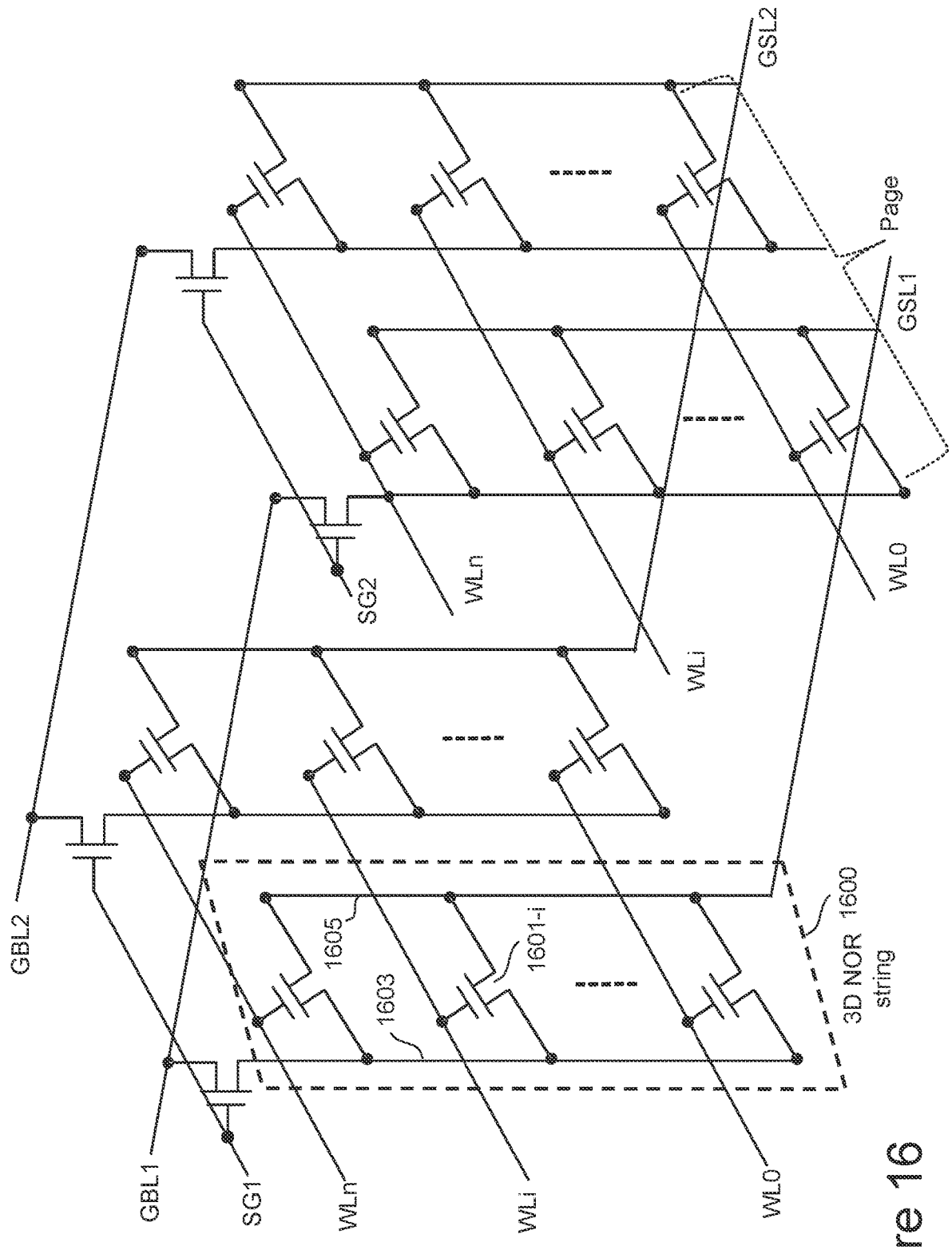
FIG. 16 is a schematic representation of a portion of a memory array having a 3D NOR architecture.

FIG. 16 is a schematic representation of a portion of an embodiment for a memory array having a 3D NOR architecture, showing four vertical NOR strings (as in FIG. 15) in a 2×2 arrangement, where the left-most NOR string 1600 is indicated in the dashed-box. In an actual device, the number of such NOR strings can be very large, extending in both horizontal directions of the array, and the number of memory cells in each NOR string extending in the vertical direction can also be large. Each of the memory cells of a NOR string are connected between a local source line and a local bit line that both run vertically, perpendicular to substrate of the memory die, and have a channel that runs run horizontally, parallel to substrate. For example, memory cell 1601-$i$ and the other memory cells of NOR string 1600 are connected between a local bit line 1603 and a local source line 1605. The word lines of the array run horizontally in a first direction, parallel to substrate, and are connected to the control gates of the memory cells.

In FIG. 16 each NOR string or column has n word lines and are each connected to a corresponding one of the global bit lines. FIG. 16 shows two sets of n word lines (running from lower left to upper right in the oblique view of FIG. 16), but these are independent sets of word lines. The local bit lines of the NOR strings connect to global bit lines (GBL1, GBL2) that also run horizontally, parallel to substrate, but perpendicular to word lines and are here running over the top of memory cells. The global bit lines (GBL1, GBL2) connect to local bit lines by way of select gates (SG1, SG2), so that an individual memory cell can be identified by its word line and local bit line, where a local bit line can be identified by its global bit line and select gate. The select gates in this embodiment run horizontally over the substrate and above the memory cells in the same direction as the word lines. The local source lines can connect along global source lines (GSL1, GSL2) that, in this embodiment, run horizontally, parallel to substrate below array in the same direction as the global bit lines. In the embodiment of FIG. 16, the NOR string connected a given global bit line (e.g., GBL1) connect to the same global source line (e.g., GSL1), but other arrangements are possible. For example, NOR string connected to different global bit lines can be connected to a common global source line, an arrangement that can automatically sum the currents originating from different global bit line during a compute in memory multiplication. The global source lines can be connected to control circuitry along the top periphery of the array by vertical vias. Similarly, the global bit lines can be connected to bit line drivers and sensing circuitry, and the word lines and select gate lines connected to drivers, or by vias to drivers, along one or both sides of the structure. A page (the unit of writing and reading data) is also marked by the bracket in FIG. 16 and corresponds to the memory cells along a selected word line and for a selected select gate, but each connected to a different global word line.

Figure 17A:
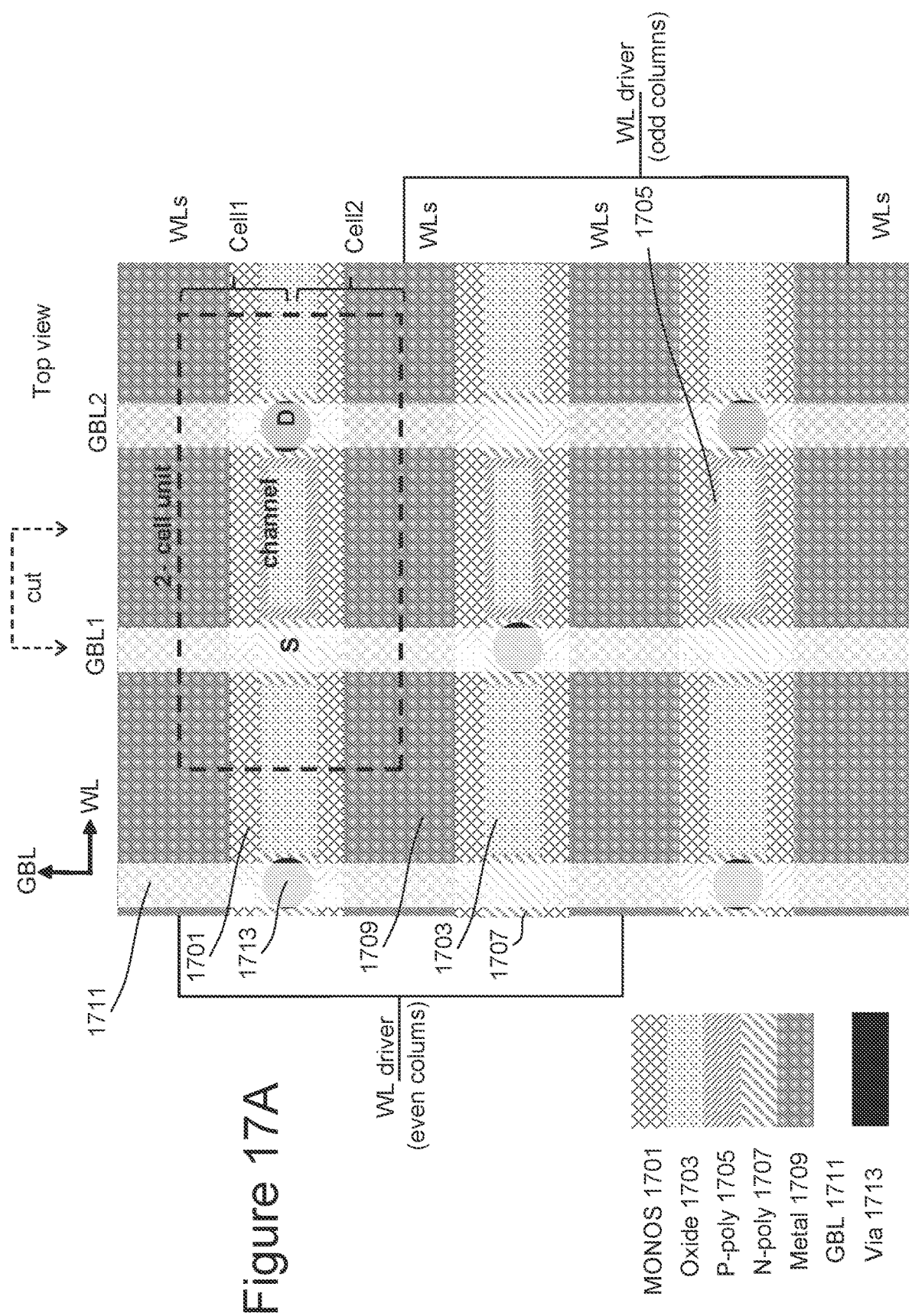
FIGS. 17A and 17B respectively illustrate a top view and a cross-section of a portion of an embodiment for a 3D NOR memory structure.
Figure 17B:
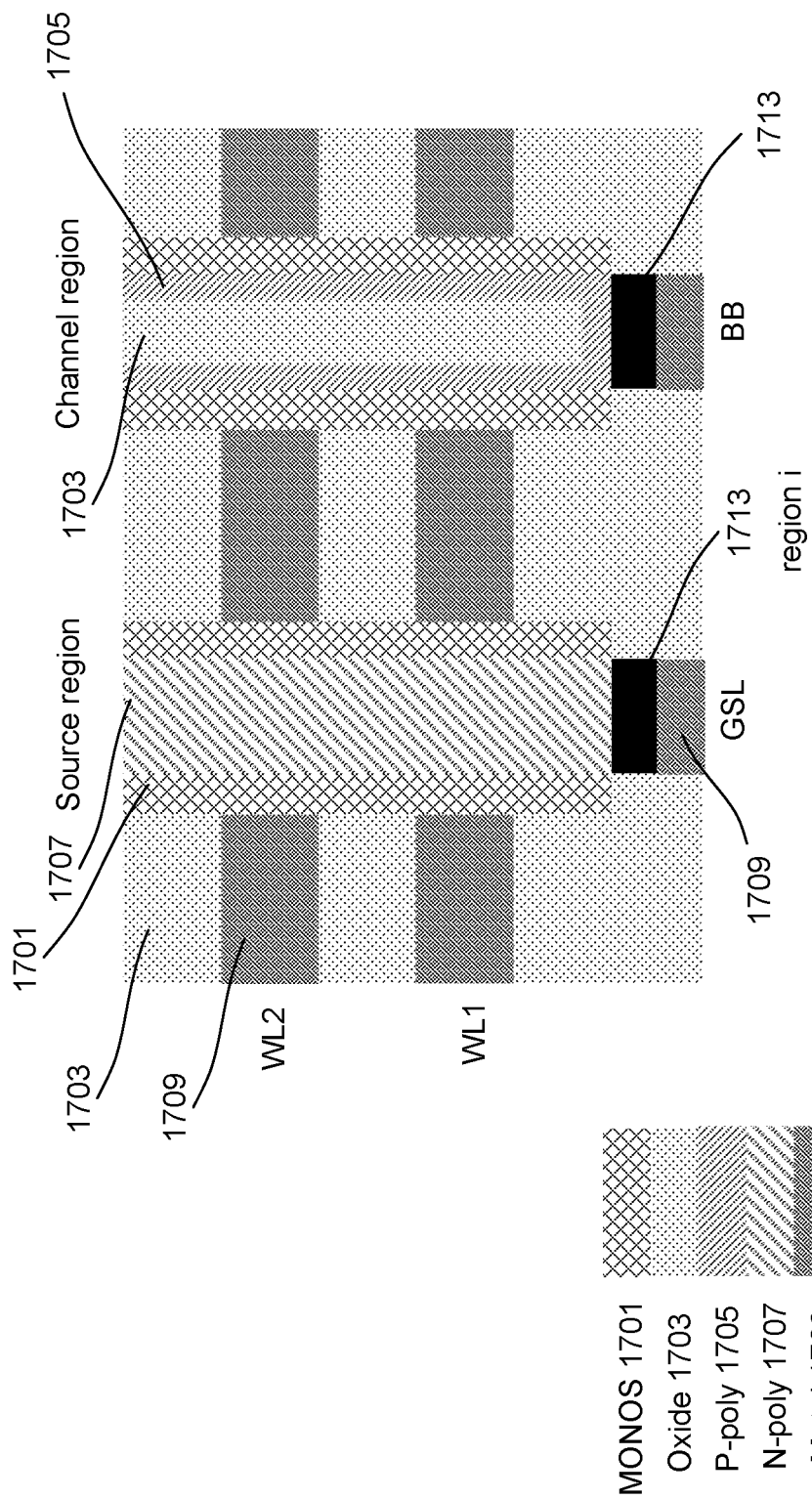

FIGS. 17A and 17B respectively illustrate a top view and a cross-section view of a portion of an array for an embodiment for a 3D NOR memory structure, where the cross-section of FIG. 17B is taken at where "cut" is indicated. In the top view of FIG. 17A, the global bit lines run up and down and the word lines run left to write. Four columns of word line (WLs) are shown, such as 1709, where these are metal layers alternating with oxide layers in a vertical stack. In this embodiment, the different word line stacks are split into even columns and odd columns that are driven by word line drivers and other row control circuitry (e.g., 520/620 of FIGS. 5 and 6) from opposite sides. The global bits, such as 1711, are conductive and run across the top of the array, where they can connect to drivers, sensing circuitry, and other column control circuitry (e.g., 510/610 of FIGS. 5 and 6). Two global bit lines GBL 1 and GBL 2 are labelled for later reference.

Also running left to right and adjacent to the word line regions are Metal Oxide Nitride Oxide Silicon (MONOS) 1701 regions, which serve as a memory film. Each memory MONOS film layer can include a blocking dielectric layer adjacent to the metal word line region 1709, a charge storage layer in the middle, and a tunneling dielectric layer adjacent to either an oxide region 1703 or a P type polysilicon (P-poly) layer 1705. The P-poly region forms a channel structure for the memory cells that runs horizontally between the source and drain (local bit line) regions (such as respectively illustrated by S and D) and includes a doped semiconductor material having a cavity filled with an oxide or other dielectric core. The local bit lines and source lines of the vertical NOR strings are vertical active pillar structures that can be formed of an N type polysilicon (N-poly) material 1707.

The local source line and bit line active pillars that alternate in both the word line and global bit line directions. In this embodiment, the local source lines connect to global source lines at the bottom of the array structure and the local bit lines connect to the global bit lines by vias 1713. For example, for the 2-cell unit illustrated by the broken box, GBL 2 is connected to the local bit line by a via at the drain region marked D, but at source region marked S there is no via at the top; however, moving down a row, GBL 1 is connected to the active pillar N-poly region by a via, but GBL2 is not connected to the underlying active pillar region. Both memory cells of the 2-cell unit are connected to the same local source and local bit lines, but are on different word lines, one odd and one even.

FIG. 17B shows a cross-section of the structure of FIG. 17A taken at the cut indicated at the top of FIG. 17A. The side view of FIG. 17B shows the alternating metal layers 1709 (in this example two word line WL1 and WL2) and separating oxide layers 1703. A source region includes the charge storing MONOS layer to either side of the active P-poly 1705 region of the local source line. A via region 1713 connects the local source line to the metal layer 1709 that forms a global source line GSL that runs into the page in this representation. The column of the channel region includes an oxide 1703 core with a P-poly 1705 to either side, which in turn has a MONOS region to either side. The channel region is here connected to metal body bias (BB) line by a via 1713, which can be used to set the body bias of the channel regions.

Figure 18:
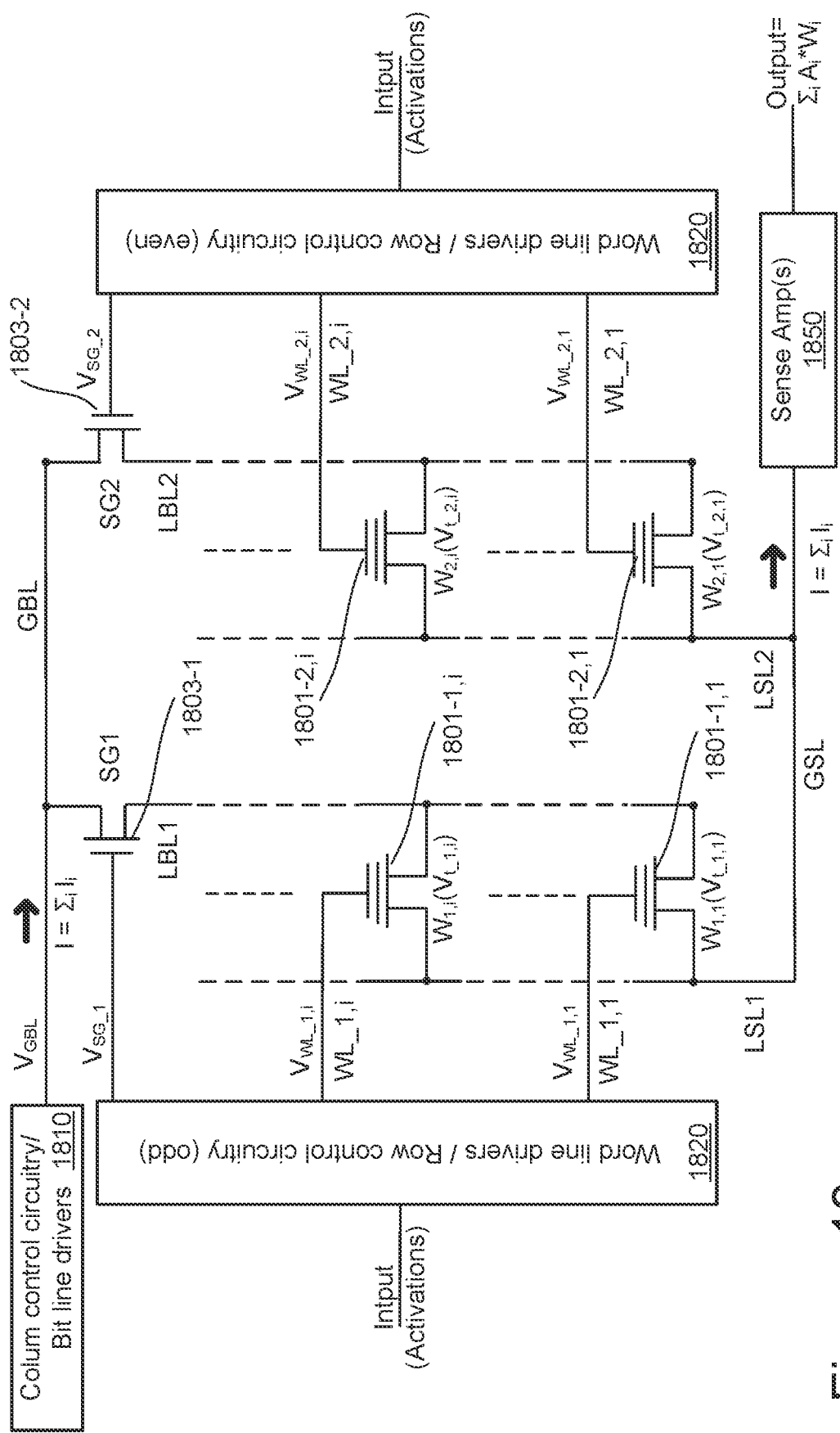
FIG. 18 illustrates a portion of a 3D NOR array as biased to perform a compute in memory vector matrix multiplication by operating the memory cells in the subthreshold region.

FIG. 18 illustrates a portion of a 3D NOR array as biased to perform a compute in memory vector matrix multiplication by operating the memory cells in the subthreshold region. Two NOR strings are shown connected along the global bit line GBL and global source line, with the two NOR string connects to GBL by respective select gate SG1 1803-1 and SG2 1803-2. Two memory cells are shown for each NOR string and connected between corresponding local source lines and local bit lines, with 1801-1,1 and 1801-1,$i$ connected between LSL1 and LBL1 on the left NOR string and 1801-2,1 and 1801-2,$i$ connected between LSL2 and LBL2 on the right NOR string. The weights are encoded as threshold voltages in each of the memory cells as described above, so that $W_{1,1}$ is encoded as $V_{t\_1,1}$, $W_{1,1}(V_{t\_1,1},)$ in memory cell 1801-1,1, for example. The word line drivers and other row control circuitry 1820 are provided for both the odd columns of word lines and even columns of word lines, corresponding to the embodiment of FIGS. 17A and 17B, and correspond to 520/620 of FIGS. 5 and 6. The word line drivers and other row control circuitry 1820 receive the activation values as inputs and converts these word line voltages, $A_i(V_{WL\_i})$, as described above with respect to equations 1 and 2. In the case of digital values for the activations, this can include a digital to analog conversion. The word line drivers and other row control circuitry 1820 also provide the control voltage $V_{SG\_1}$ and $V_{SG\_2}$ to respective select gates SG1 and SG2 to selectively connect the corresponding local bit lines LBL1 and LBL2 to the global bit line GBL.

The column control circuitry, including bit line drivers, 1810 biases the global bit line GBL at a voltage $V_{GBL}$ for a compute in memory operation and can correspond to elements of 510/610 of FIGS. 5 and 6. To perform the multiplication between the activations and weights of a layer of a neural network, the corresponding select gate are turned on and the activations encoded as word line voltages and applied to the array. As discussed above with respect to equations 1 and 1, the result current I from the global bit line GBL into the global source line GSL is then output of the vector matrix multiplication. Depending on the embodiment, the current can either be measured from the bit line side or the source line side. In the embodiment shown in FIG. 18, the sense amplifiers 1850 measure the accumulated current on the source lines to generate the output. Although the current in the global source line originates from the single global bit line GBL, in some embodiments a global source line can be connected to NOR strings connected different global bit lines and the cumulative current measured by the sense amplifiers can reflect current originating from multiple global bit lines. Depending on the embodiment, the output from the sense amplifiers 1850 can either be an analog value or an analog to digital conversion can convert the current value to a digital value. As noted above, when operated in the subthreshold region the individual currents through the individual memory cells can be quite small and difficult to accurately measure, but by biasing the multiple memory cells of a NOR string or strings concurrently the combined current at the source line can readily be determined. In the compute in memory multiplication illustrated in FIG. 18, the inputs can the initial input of a network or the output from a preceding hidden layer. Similarly, the output can be the final output of the network or be an input to a following layer.

To operate the memory cells of the NOR array in the subthreshold range places a number of considerations on the memory cell design points and operation range. To operate in the subthreshold region, the gate overdrive (the difference between the voltage $V_{WL\_i}$ applied to the corresponding word line and the memory cell's threshold voltage $V_{t\_i}$, or $V_{WL\_i}-V_{t\_i}$)< needs to negative, so that, for example $-2V<(V_{WL\_i}-V_{t\_i})<0V$. To reduce the impact of variations in threshold voltage Vt for the programmed memory cells, the difference $\Delta V_t$ between weight levels should be large enough so that different weight values can be distinguish, such $\Delta V_t \geq 0.15V$, for example. The difference in word line bias levels, $\Delta V_{WL}$, should be large enough to minimize the effects of circuit noise and RC delays, such as $\Delta V_{WL} \geq 0.1V$, for example. Also, to feasibly have more weight levels, the memory cells can operate with relatively high $V_t$ values to achieve a large subthreshold slope.

FIGS. 19A-19D are tables that provide several embodiments for varying numbers of bit resolution for both inputs/activations. FIG. 19A illustrates a 4-level activation×4-level weight example, where the activations are encoded as word line voltages between 3.6V and 3.9V with a step size of 0.1V and the weights are encoded as threshold voltages between 4V and 4.9V with a step size of 0.3V. These values meet the subthreshold condition on the overdrive voltage ($V_{WL\_i}1-V_{t\_i}$) as $-1.3V<(V_{WL\_i}-V_{t\_i})<-0.1V$. FIG. 19 illustrates an 8-level activation×4-level weight example, where the eight activation levels are encoded as word line voltages between 3.2V and 3.9V with a step size of 0.1V and the weights are encoded as threshold voltages between 4V and 4.9V with a step size of 0.3V, where these values meet the subthreshold condition on the overdrive voltage as $-1.7V<(V_{WL\_i}1-V_{t\_i})<-0.1V$. In the 8-level activation×8-level weight example of FIG. 19C, the activations are encoded as word line voltage ranging from 3.2V to 3.9V with a step size of 0.1V, the weights are encoded as threshold voltages ranging from 4V to 5.05V with a step size of 0.15V, and the subthreshold condition is met as $-1.85V<(V_{WL\_i}-V_{t\_i})<-0.1V$. FIG. 19C is a 16-level activation×4-level weight example where the activations are encoded as word line voltage ranging from 2.4V to 3.9V with a step size of 0.1V, the weights are encoded as threshold voltages ranging from 4V to 4.45V with a step size of 0.15V, and the subthreshold condition is met as $-2.05V<(V_{WL\_i}-V_{t\_i})<-0.1V$.

As illustrated in these examples, the use of a 3D NOR architecture in which multiple vertical NOR strings connect to one bit line provide a high density, low power compute in memory device. As illustrated by FIGS. 17A-18, the inclusion of select gates and drivers for both the even and odd sets of word lines, two NOR strings can be individually biased with activations to contribute to the product. Additionally, multiplications for multiple bit lines with a given plane can be performed at the same time. Although each memory cell's current is small under subthreshold conditions, the total bit line to source line current is large enough for fast sensing since it is the sum of the currents from all of the selected memory cells.

Figure 20:
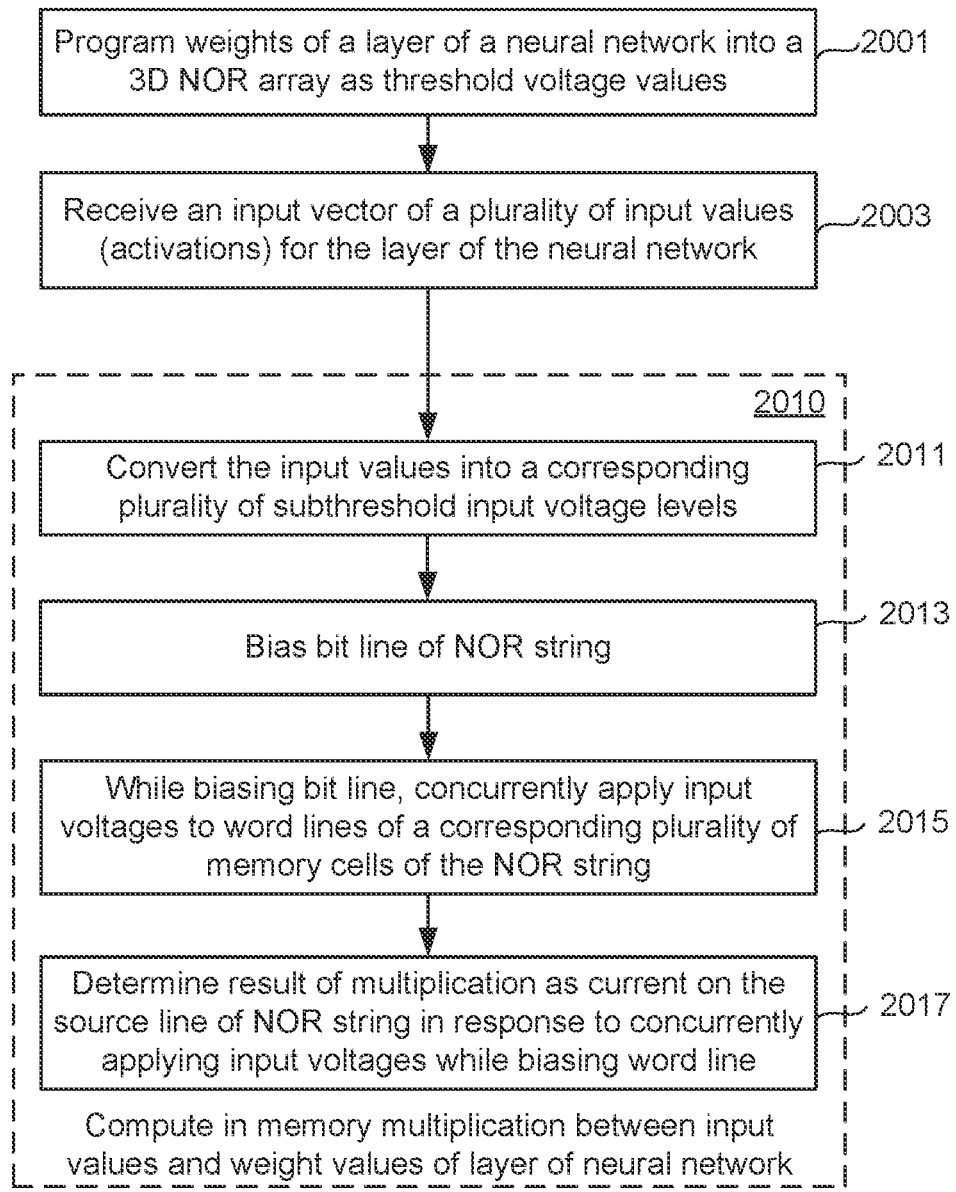
FIG. 20 is a flowchart for one embodiment of performing compute in memory operations for a neural network using a three dimensional NOR memory operated in the subthreshold region.

FIG. 20 is a flowchart for one embodiment of performing compute in memory operations for a neural network using a three dimensional NOR memory operated in the subthreshold region. Beginning at step 2001, a set of weights for one or more layers of a neural network is programmed into one or more arrays 502/602 of one or more memory dies 500/601 of FIG. 5 or 6 as threshold voltage values of memory cells. The weights can be programmed in by a user or have been preprogrammed prior to the devices being provided to the user. For example, a host 120 can provide a set of weights previously determined in a training process for the network to a memory system's controller 102, from which they are provided to the memory dies of the memory system 100 and programmed into the one or more arrays using the control circuitry of the system control logic 560/660, column control circuitry 510/610, and row control circuitry 520/620.

At step 2003 an input vector of a set of input values, or activations, is received, where this can be the initial input for the first layer of the neural network or a subsequent layer. In the case of an initial input, this can be received from a host 120 at the memory controller 102, which then sends the input vector on to the appropriate memory die. For subsequent layers, the input can be the output of a preceding layer generated by a compute in memory operation, either on the same or a different memory die of the memory system.

At step 2010 the compute in memory multiplication between the activation inputs from step 2003 and the weights of 2001 using the three dimensional NOR structure as described above. As illustrated in portion of the array in FIG. 18, the weights of the layer are stored in the memory cells 1801 encoded as threshold voltages in one or more NOR strings, where the memory cells of a NOR string are connected in parallel between a (local) bit line and a (local) source line. At step 2011 the input vector of activations are converted by the word line drivers and row control circuitry 1820 to corresponding voltage levels for applying to the word lines, where, for subthreshold operation, the range of word line voltages levels are below the range of threshold voltage levels programmed into the memory cells, as illustrated in the examples of FIGS. 19A-19D. The bit line is biased at step 2013, where the local bit line of a selected NOR sting can be biased by the column control circuitry and bit line drivers 1810 from a global bit line through a corresponding select gate 1803. With the bit line biased, the word line voltage of the encoded activations are concurrently applied to multiple memory cells of the one or more selected NOR strings by the word line drivers and row control circuitry 1820 at step 2015. The result of the multiplication then corresponds the cumulative subthreshold current between the bit lines and sources lines, which is determined at step 2017. The current can be determined at the source line such as the sense amplifiers 1850 or, in other embodiments, from the bit line side. The output for the layer can either be provided to the host 120, such for the final output of a neural network, or be used as the input for a subsequent layer whose weights are encoded in the memory cells on the same memory die or another memory die of the memory system.

According to a first set of aspects, a non-volatile memory device includes a control circuit configured to connect to an array of non-volatile memory cells including a plurality of NOR strings. Each of the NOR strings comprise a plurality of memory cells connected in parallel between a local bit line and a local source line and each of the memory cells is connected to a corresponding word line and configured to store a weight value of a neural network encoded as a threshold voltage. The control circuit is configured to: receive a first plurality input values for a layer of the neural network; convert the first plurality of input values for the layer into a corresponding first plurality of input voltages having voltage values configured to operate the memory cells in a subthreshold region; and concurrently: bias the local bit line of a first NOR string storing weight values of the layer of neural network, apply the first plurality of the input voltages to word lines corresponding to memory cells of the first NOR string, and determine a product of the weight values of the layer of neural network stored in the first NOR string and the first plurality of input values for the layer from a current on the local source line of the first NOR string.

In additional aspects, a method includes receiving an input vector including a first plurality of activations for a first layer of a neural network and performing a compute in memory multiplication between the first plurality of activation for the first layer of the neural network and a first plurality of weights of the first layer of the neural network. The first plurality of weights of the first layer of the neural network stored is encoded in a corresponding first plurality of memory cells as threshold voltages, where the first plurality of memory cells are connected in parallel between a first bit line and a first source line. The compute in memory multiplication is performed by: converting the first plurality of activations for the first layer of the neural network into a corresponding first plurality of input voltage levels, each of the first plurality of input voltage levels being less than threshold voltages of the first plurality of memory cells; biasing the first bit line; while biasing the first bit line, concurrently applying input first plurality of input voltage levels to a corresponding one of the first plurality of memory cells; and determining a current on the first source line in response to concurrently applying input first plurality of input voltage levels to the corresponding ones of the first plurality of memory cells while biasing the first bit line.

In another set of aspects, a non-volatile memory device includes an array of non-volatile memory cells each having a programmable threshold voltage and one or more control circuits connected to the array of non-volatile memory cells. The array has a three dimensional NOR architecture formed over a substrate and comprises a plurality of NOR strings, each of the NOR strings comprising a plurality of memory cells connected in parallel between a local bit line and a local source line running perpendicularly to a surface of the substrate, each of the memory cells connected to a corresponding word line running parallel to the substrate, having a channel that runs parallel to the substrate. The one or more control circuits are configured to: bias the local bit line of a first of the NOR stings; while biasing the local bit line of the first NOR string, concurrently applying a plurality of subthreshold word line voltages to a plurality of word lines connected to a corresponding plurality of memory cells of the first NOR string; and determining a cumulative amount of current flowing between the local bit line of the first NOR string and the local source line of the first NOR through the corresponding plurality of memory cells of the first NOR string in response to applying the plurality of subthreshold word line voltages to the plurality of word lines while biasing the local bit line of the first NOR string.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
a control circuit configured to connect to an array of non-volatile memory cells including a plurality of NOR strings, each of the NOR strings comprising a plurality of the memory cells connected in parallel between a local bit line and a local source line, each of the memory cells connected to a corresponding word line, and each of the memory cells configured to store a multi-bit weight value of a neural network encoded as a threshold voltage, the control circuit configured to:
  receive a first plurality multi-bit input values for a layer of the neural network;
  convert each of the first plurality of multi-bit input values for the layer into one of a corresponding first plurality of input voltages, each of the first plurality of input voltages having a voltage value less than all of the threshold voltage as which the multi-bit weight values are encoded thereby configured to operate the memory cells in a subthreshold region; and
  concurrently bias the local bit line of a first NOR string storing multi-bit weight values of the layer of neural network, apply the first plurality of the input voltages to word lines corresponding to memory cells of the first NOR string, and determine a product of the multi-bit weight values of the layer of neural network stored in the first NOR string and the first plurality of multi-bit input values for the layer from a current on the local source line of the first NOR string.

2. The non-volatile memory device of claim 1, wherein the control circuit is formed on a control die, the non-volatile memory device further comprising:
a memory die including the array of non-volatile memory cells, the memory die formed separately from and bonded to the control die.

3. The non-volatile memory device of claim 1, wherein the control circuit is further configured to:
receive a second plurality of multi-bit input values for the layer of the neural network;

convert the second plurality of multi-bit input values for the layer into a corresponding second plurality of input voltages having voltage values configured to operate the memory cells in the subthreshold region; and concurrently with determining the product of the multi-bit weight values of the layer of neural network stored in the first NOR string and the first plurality of multi-bit input values for the layer from the current on the local source line of the first NOR string: bias the local bit line of a second NOR string storing multi-bit weight values of the layer of neural network, apply the second plurality of the input voltages to word lines corresponding to memory cells of the second NOR string, and determine a sum of the product of the multi-bit weight values of the layer of neural network stored in the first NOR string and the first plurality of multi-bit input values for the layer and the product of the multi-bit weight values of the layer of neural network stored in the second NOR string and the second plurality of multi-bit input values for the layer from a combined current on the local source line of the first and second NOR strings.

4. The non-volatile memory device of claim 1, wherein the control circuit is further configured to:
receive the multi-bit weight values of the layer of neural network from a host; and
programming the memory cells to store the received multi-bit weight values of the neural network encoded as threshold voltages.

5. The non-volatile memory device of claim 1, wherein the control circuit is further configured to:
provide the product of the multi-bit weight values of the layer of neural network stored in the first NOR string and the first plurality of multi-bit input values for the layer as an input value for a subsequent layer of the neural network.

6. The non-volatile memory device of claim 1, further comprising the array of non-volatile memory cells, where the array of non-volatile memory cells has a three dimensional NOR architecture formed over a substrate in which the local bit lines and the local source lines run perpendicularly to a surface of the substrate, the word lines run parallel to the substrate, and the memory cells each have a channel that runs parallel to the substrate.

7. The non-volatile memory device of claim 1, wherein the neural network is a generative pre-trained transformer (GPT).

8. The non-volatile memory device of claim 1, wherein the multi-bit weight values of the neural network are encoded as one of a plurality of threshold voltage values in a first voltage range, the input voltages values are one of plurality of voltage values in a second voltage range, and voltage values of the first voltage range are higher than the voltage values of the second voltage range.

9. A method, comprising:
receiving an input vector including a first plurality of multi-bit activations for a first layer of a neural network; and
performing a compute in memory multiplication between the input vector for the first layer of the neural network and a plurality of multi-bit weight values of the first layer of the neural network, a first plurality of the plurality of the multi-bit weight values stored encoded in a corresponding first plurality of memory cells as threshold voltages, the first plurality of memory cells connected in parallel between a first bit line and a first source line, the compute in memory multiplication is performed by:
converting the first plurality of multi-bit activations for the first layer of the neural network into a corresponding first plurality of input voltage levels, each of the first plurality of input voltage levels being less than the threshold voltages of the first plurality of memory cells storing the multi-bit weight values to thereby operate the first plurality of memory cells in a subthreshold region;
biasing the first bit line;
while biasing the first bit line, concurrently applying each of the first plurality of input voltage levels to a corresponding one of the first plurality of memory cells; and
determining a current on the first source line in response to concurrently applying the first plurality of input voltage levels to the corresponding ones of the first plurality of memory cells while biasing the first bit line.

10. The method of claim 9, further comprising:
receiving the first plurality of multi-bit weight values of the first layer; and
programming the first plurality of multi-bit weight values of the first layer into the corresponding first plurality of memory cells encoded as threshold voltages.

11. The method of claim 9, wherein the input vector further includes a second plurality of multi-bit activations for the first layer of the neural network, a second plurality of the plurality of multi-bit weight values of the first layer of the neural network are stored encoded in a corresponding second plurality of memory cells as threshold voltages, the second plurality of memory cells connected in parallel between a second bit line and a second source line, and the method further comprises:
converting the second plurality of multi-bit activations for the first layer of the neural network into a corresponding second plurality of input voltage levels, each of the second plurality of input voltage levels being less than threshold voltages of the second plurality of memory cells;
biasing the second bit line;
while biasing the second bit line, concurrently applying each of the second plurality of input voltage levels to a corresponding one of the second plurality of memory cells;
concurrently with determining the current on the first source line, determining a current on the second source line in response to concurrently applying the second plurality of input voltage levels to the corresponding ones of the second plurality of memory cells while biasing the second bit line; and
determining a combined current on the first source line and the second source line.

12. The method of claim 9, further comprising:
converting the current on the first source line to an input for a second layer of the neural network.

13. The method of claim 9, further comprising:
receiving the input vector from a host.

14. A non-volatile memory device, comprising:
an array of non-volatile memory cells each programmable to one of a plurality of threshold voltage values corresponding to a multi-bit state, the array having a three dimensional NOR architecture formed over a substrate and comprising a plurality of NOR strings, each of the NOR strings comprising a plurality of memory cells connected in parallel between a local bit line and a local source line running perpendicularly to a surface of the substrate, each of the memory cells connected to a corresponding word line running parallel to the substrate and having a channel that runs parallel to the substrate;

one or more control circuits connected to the array of non-volatile memory cells and configured to:
  bias the local bit line of a first of the NOR stings;
  while biasing the local bit line of the first NOR string, concurrently applying one of a plurality of word line voltages to each of a plurality of the word lines connected to a corresponding plurality of memory cells of the first NOR string, each of the plurality of word line voltages corresponding to one of a plurality of multi-bit input values, each of the plurality of word line voltages having a value less than the plurality of threshold voltage values corresponding to a multi-bit state to thereby operate the memory cells in the subthreshold region; and
  determining a cumulative amount of current flowing between the local bit line of the first NOR string and the local source line of the first NOR string through the corresponding plurality of memory cells of the first NOR string in response to applying the plurality of subthreshold word line voltages to the plurality of word lines while biasing the local bit line of the first NOR string.

15. The non-volatile memory device of claim 14, wherein:
the memory cells of the first NOR string are configured to store multi-bit weight values of a first layer of a neural network encoded as threshold voltage values, and
the one or more control circuits are further configured to:
  receive a plurality of multi-bit activations for the first layer of the neural network; and
  encode the plurality of multi-bit activations for the first layer of the neural network as the plurality of word line voltages corresponding to one of the plurality of multi-bit input values, wherein the first layer of the neural network and the activations for the first layer of the neural network.

16. The non-volatile memory device of claim 15, wherein the one or more control circuits are configured to:
  receive the weight values of the first layer of the neural network from a host; and
  program the weight values of the first layer of the neural network into the memory cells of the first NOR string as the threshold voltage values.

17. The non-volatile memory device of claim 14, wherein the array of non-volatile memory cells further comprises:
  one or more global bit line running parallel to the substrate;
  a plurality of select gates, the local bit line of each of the NOR strings connectable one of the global bit line by a corresponding one of the select gates; and
  one or more global source lines, the local source line of each of the NOR strings connected to one of the global source lines,
  wherein the one or more control circuits are configured to:
  bias the local bit line of the first NOR string from one of the global bit lines through a corresponding select gate.

18. The non-volatile memory device of claim 17, wherein the one or more control circuits are configured to:
  determine the cumulative amount of current flowing between the local bit line of the first NOR string and the local source line of the first NOR string from an amount of current in the global source line to which the first NOR string is connected by the corresponding select gate.

19. The non-volatile memory device of claim 17, wherein the one or more control circuits are configured to:
  determine the cumulative amount of current flowing between the local bit line of the first NOR string and the local source line of the first NOR string from an amount of current in one of the global source lines to which the first NOR string is connected.

20. The non-volatile memory device of claim 14, wherein each of the non-volatile memory cells include a charge storage region and the threshold voltage of the memory cell corresponds to an amount of charge stored in the charge storage region.

* * * * *